(12) United States Patent
Kim

(10) Patent No.: US 11,456,344 B2
(45) Date of Patent: Sep. 27, 2022

(54) ORGANIC LIGHT EMITTING DISPLAY DEVICE WITH BANK OPENINGS ON THE NON-DISPLAY REGION

(71) Applicant: LG Display Co., Ltd., Seoul (KR)

(72) Inventor: Kanghyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 89 days.

(21) Appl. No.: 17/085,347

(22) Filed: Oct. 30, 2020

(65) Prior Publication Data

US 2021/0143236 A1 May 13, 2021

(30) Foreign Application Priority Data

Nov. 7, 2019 (KR) .......................... 10-2019-0142074

(51) Int. Cl.
*H01L 27/32* (2006.01)

(52) U.S. Cl.
CPC ...... *H01L 27/3246* (2013.01); *H01L 27/3216* (2013.01)

(58) Field of Classification Search
CPC .......................... H01L 27/3246; H01L 27/3216
See application file for complete search history.

(56) References Cited

U.S. PATENT DOCUMENTS

| | | | | |
|---|---|---|---|---|
| 2005/0264177 | A1* | 12/2005 | Chung | H01L 27/3223 313/506 |
| 2014/0225089 | A1* | 8/2014 | Kato | H01L 27/3246 257/40 |
| 2018/0070461 | A1* | 3/2018 | Lee | G09G 3/3225 |
| 2019/0341576 | A1* | 11/2019 | Ochi | H05B 33/22 |
| 2019/0363146 | A1* | 11/2019 | Takahashi | H01L 51/5243 |
| 2019/0363275 | A1* | 11/2019 | Ochi | H05B 33/04 |
| 2020/0194518 | A1* | 6/2020 | Myung | H01L 27/3223 |
| 2020/0212356 | A1* | 7/2020 | Kim | G09G 3/006 |
| 2020/0235178 | A1* | 7/2020 | Shin | H01L 51/5056 |
| 2021/0013297 | A1* | 1/2021 | Okabe | H01L 27/3276 |
| 2021/0175281 | A1* | 6/2021 | Choi | H01L 33/38 |
| 2021/0175470 | A1* | 6/2021 | Kang | H01L 51/5253 |
| 2021/0202615 | A1* | 7/2021 | Kim | H01L 27/3246 |
| 2021/0202629 | A1* | 7/2021 | Myung | H01L 27/3223 |
| 2021/0265429 | A1* | 8/2021 | Yamanaka | H05B 33/02 |
| 2022/0020827 | A1* | 1/2022 | Liu | H01L 51/5209 |
| 2022/0093652 | A1* | 3/2022 | Park | H01L 33/48 |

* cited by examiner

*Primary Examiner* — Peter Bradford
(74) *Attorney, Agent, or Firm* — Fenwick & West LLP

(57) ABSTRACT

Provided is an organic light emitting display device, which includes a substrate including a display area including a plurality of sub-pixels and a non-display area other than the display area; an overcoat layer on the substrate; a plurality of first electrodes disposed on the overcoat layer in the plurality of sub-pixels; a first bank disposed in the display area and the non-display area and including a plurality of first openings exposing the plurality of first electrodes; a second bank disposed on the first bank in the display area and the non-display area and including a plurality of second openings exposing the plurality of first electrodes arranged in one direction; and a plurality of organic light emitting layers disposed in the plurality of second openings, respectively, wherein at least one among the plurality of second openings is split into at least two branch lines in the non-display area.

10 Claims, 16 Drawing Sheets

ORGANIC LIGHT EMITTING DISPLAY DEVICE WITH BANK OPENINGS ON THE NON-DISPLAY REGION

CROSS-REFERENCE TO RELATED APPLICATIONS

This application claims the priority of Republic of Korea Patent Application No. 10-2019-0142074 filed on Nov. 7, 2019, in the Korean Intellectual Property Office, the disclosure of which is incorporated by reference in its entirety.

BACKGROUND

Technical Field

The present disclosure relates to an organic light emitting display device.

Related Technology

Recently, various display devices have been developed that can reduce weight and size, which are disadvantages of cathode ray tubes. Such display devices include a liquid crystal display (LCD), a plasma display panel (PDP), a field emission display (FED), an organic light emitting display device (OLED), and the like.

The organic light emitting display device is a self-emission device that emits light by itself, and has a fast response speed, high light emission efficiency, high brightness, and a wide viewing angle. In addition, since a device can be formed on a flexible substrate such as plastic, a flexible display device can be implemented.

Recently, as an organic light emitting display device with a large-area and high resolution is required, a plurality of sub-pixels is included in a single panel. In general, since a mask is used for patterning red R, green G, and blue B sub-pixels to realize a large-area display device, a fine metal mask corresponding to said large-area is required. However, a phenomenon in which the mask sags downward occurs as the area increases, and various defects such as misplaced deposition problem of the organic light emitting material constituting the light emitting layer can be caused.

In order to solve the problems of the deposition using the above-described mask, a simple but advantageous solution process for a large-area is attracting attention. The solution process is capable of large-area patterning without a mask through inkjet printing or nozzle printing, and has a material use rate of 50% to 80% which is higher than that of vacuum deposition with a material use rate of 10% or less. In addition, its glass transition temperature is higher than that of the vacuum-deposited thin film, so it has excellent thermal stability and superior morphology characteristics.

However, when the light emitting layer is formed by the solution process, non-uniformity of a thickness occurs due to a thickness variation depending on the position in the sub-pixel, resulting in a problem that the display quality is significantly lowered.

SUMMARY

Accordingly, an object of the present disclosure is to provide an organic light emitting display device having a heterogeneous bank structure.

According to an aspect of the present disclosure, there is provided an organic light emitting display device, which includes a substrate including a display area including a plurality of sub-pixels and a non-display area other than the display area; an overcoat layer on the substrate; a plurality of first electrodes disposed on the overcoat layer in the plurality of sub-pixels; a first bank disposed in the display area and the non-display area and including a plurality of first openings exposing the plurality of first electrodes; a second bank disposed on the first bank in the display area and the non-display area and including a plurality of second openings exposing the plurality of first electrodes arranged in one direction; and a plurality of organic light emitting layers disposed in the plurality of second openings, respectively, wherein at least one among the plurality of second openings is split into at least two branch lines in the non-display area.

The plurality of second openings may include a 2-1 opening, a 2-2 opening, and a 2-3 opening including the organic light emitting layers which are different from each other.

The 2-1 opening may not be split, and the 2-2 opening and 2-3 opening may be split into more than two branch lines.

The number of branch lines of the 2-2 opening may be equal to or less than the number of branch lines of the 2-3 opening.

At least one among the 2-1 opening, the 2-2 opening and the 2-3 opening may have the branch lines connected to each other at ends thereof.

At least one among the 2-1 opening, the 2-2 opening and the 2-3 opening may include at least one horizontal branch line connecting the branch lines to each other.

The organic light emitting layer formed in the 2-1 opening may be a red light emitting layer, the organic light emitting layer formed in the 2-2 opening may be a green light emitting layer, and the organic light emitting layer formed in the 2-3 opening may be a blue light emitting layer.

Widths of the 2-1 opening, the 2-2 opening and the 2-3 opening may be different from each other.

A width of the 2-1 opening may be smaller than a width of the 2-2 opening, and the width of the 2-2 opening may be smaller than a width of the 2-3 opening.

The first bank may have hydrophilicity and the second bank may have hydrophobicity.

According to the present disclosure, it is possible to suppress the organic light emitting material from moving from the non-display area to the display area by increasing the area between the organic light emitting material and the hydrophobic side surface of the second bank by forming branch lines of the second opening in the non-display area. In addition, according to the present disclosure, the branch lines of the second opening generate a capillary phenomenon so that the organic light emitting material is formed to have a predetermined thickness in the non-display area.

Accordingly, during the solution process, a decrease in display quality due to a variation in thickness of the organic light emitting layer according to the position can be remarkably improved, and the length of the branch lines can be shortened, thereby reducing the bezel area.

DETAILED DESCRIPTION

Hereinafter, embodiments of the present disclosure will be described with reference to the accompanying drawings. Throughout the specification, the same reference numbers refer to substantially the same elements. In the following description, when it is considered such that the detailed description of the conventional art or configuration related to the present disclosure may unnecessarily obscure the subject matter of the present disclosure, the detailed description may be omitted. In describing various embodiments, the same elements may be representatively described at the outset and may be omitted in other embodiments.

Terms including ordinal numbers such as first and second may be used to describe various elements, but the elements are not limited by the terms. The terms are used only for the purpose of distinguishing one element from other elements.

Figure 1:
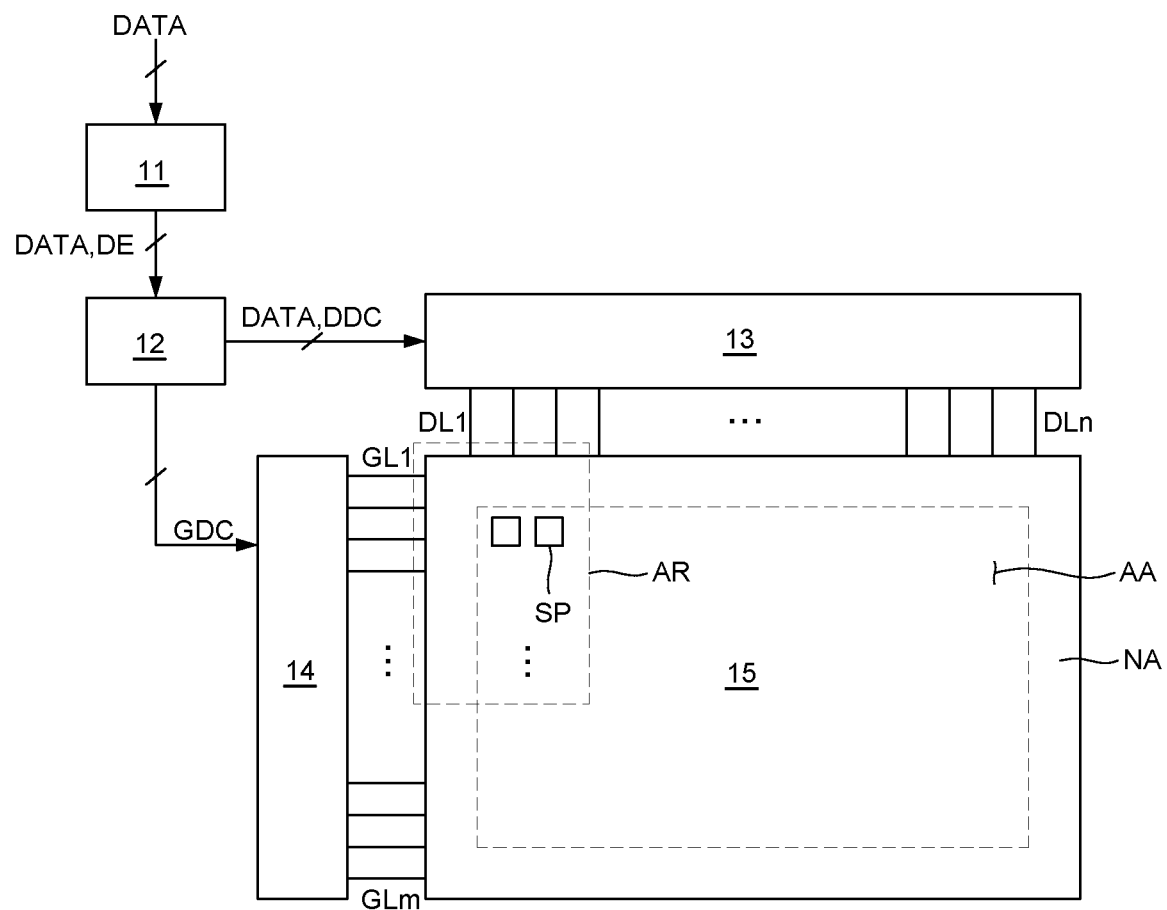
FIG. 1 is a schematic block diagram of an organic light emitting display device according to one embodiment.
Figure 2:
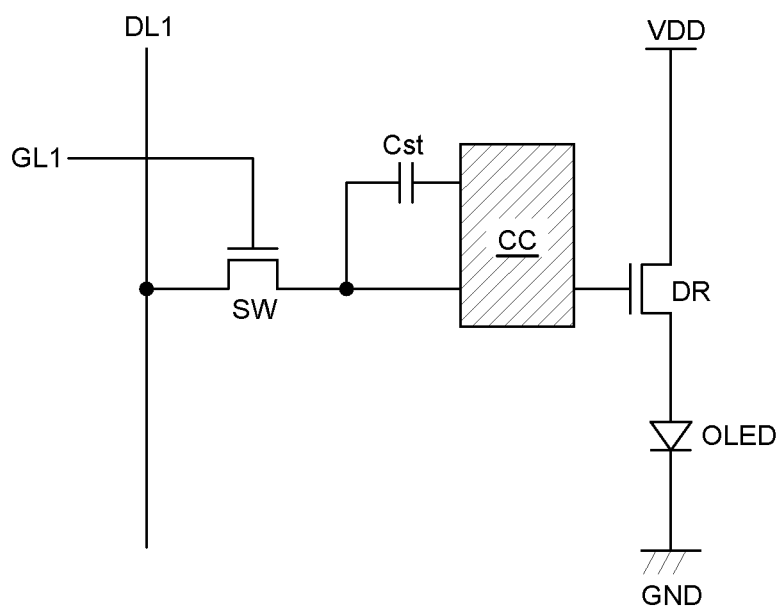
FIGS. 2 and 3 are schematic views showing sub-pixels shown in FIG. 1 according to one embodiment.
Figure 3:
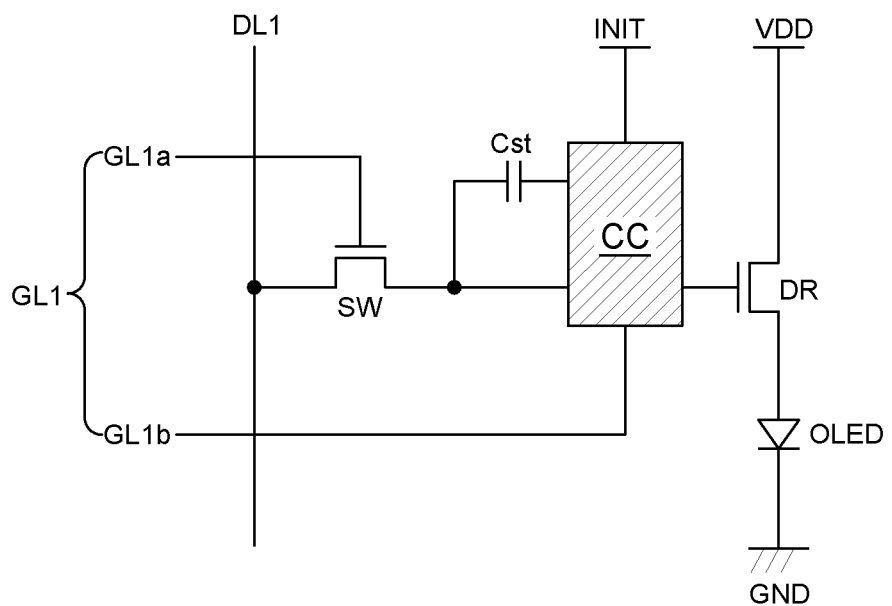

FIG. 1 is a schematic block diagram of an organic light emitting display device. FIGS. 2 and 3 are schematic diagrams of sub-pixels illustrated in FIG. 1.

Referring to FIG. 1, the organic light emitting display device includes an image processing unit 11, a timing control unit 12, a data driving unit 13, a gate driving unit 14, and a display panel 15.

The image processing unit 11 outputs a data enable signal DE and the like along with a data signal DATA supplied from the outside. The image processing unit 11 may output one or more of a vertical synchronization signal, a horizontal synchronization signal, and a clock signal in addition to the data enable signal DE, but these signals may be omitted for convenience of explanation. The image processing unit 11 is formed in the form of an integrated circuit IC on a system circuit board.

The timing control unit 12 receives a data signal DATA along with a driving signal including a data enable signal DE or a vertical synchronization signal, a horizontal synchronization signal, and a clock signal from the image processing unit 11.

The timing control unit 12 outputs a gate timing control signal GDC for controlling the operation timing of the gate driving unit 14 and a data timing control signal DDC for controlling the operation timing of the data driving unit 13 based on the driving signal. The timing control unit 12 is formed in the form of an IC on a control circuit board.

The data driving unit 13 samples and latches the data signal DATA supplied from the timing control unit 12 in response to the data timing control signal DDC supplied from the timing control unit 12 to convert it into a gamma reference voltage and then output. The data driving unit 13 outputs the data signal DATA through the data lines DL1 to DLn. The data driving unit 13 is formed on a data circuit board in the form of an IC and can be attached to the display panel 15.

The gate driving unit 14 outputs a gate signal while shifting the level of the gate voltage in response to the gate timing control signal GDC supplied from the timing controller 12. The gate driving unit 14 outputs a gate signal through the gate lines GL1 to GLm. The gate driving unit 14 may be in the form of an IC on a gate circuit board to be attached to the display panel 15, or may be formed on the display panel 15 by a gate in panel method.

The display panel 15 includes a display area AA for displaying an image and a non-display area NA other than the display area AA. The display area AA includes sub-pixels SP. The sub-pixels may be defined by a crossing structure of signal lines.

The display panel 15 displays an image corresponding to the data signal DATA and the gate signal supplied from the data driving unit 13 and the gate driving unit 14, respectively. The non-display area NA includes pads on which a circuit board is bonded and receives a signal from the circuit board, and link lines connected to the pads to transmit the signal to sub-pixels SP of the display area AA.

Referring to FIG. 2, one sub-pixel includes a switching transistor SW, a driving transistor DR, a compensation circuit CC, and an organic light emitting diode OLED. The organic light emitting diode OLED operates to emit light according to a driving current generated by the driving transistor DR.

The switching transistor SW operates to switch the data signal supplied through the first data line DL1 to be stored as a data voltage in a capacitor Cst in response to the gate signal supplied through the first gate line GL1. The driving transistor DR operates such that a driving current flows between the high potential power line VDD and the low potential power line GND according to the data voltage stored in the capacitor Cst. The compensation circuit CC is a circuit for compensating the threshold voltage of the driving transistor DR. Also, the capacitor Cst connected to the switching transistor SW or the driving transistor DR may be located inside the compensation circuit CC.

The compensation circuit CC includes one or more thin film transistors and capacitors. The configuration of the compensation circuit CC can be very diverse according to the compensation method, and detailed examples and descriptions thereof may be omitted accordingly.

In addition, as shown in FIG. 3, when the compensation circuit CC is included, the sub-pixel further includes a signal line and a power line for driving a compensation thin film transistor and supplying a specific signal or power. The added signal line may be defined as a 1-2 gate line GL1b for driving the compensation thin film transistor included in the sub-pixel. In addition, the added power line may be defined as an initialization power line INIT for initializing a specific node of a sub-pixel to a specific voltage. However, this is merely for an example and is not limited thereto.

Meanwhile, in FIGS. 2 and 3, a compensation circuit CC included in one sub-pixel is illustrated as an example. However, the compensation circuit CC may be omitted when the subject of compensation is located outside the sub-pixel, such as the data driving unit 13. That is, one sub-pixel is basically configured of a 2T (Transistor) and 1C (Capacitor) structure including a switching transistor SW, a driving transistor DR, a capacitor Cst, and an organic light emitting diode OLED, but when a compensation circuit CC is added, it may be variously configured such as 3T1C, 4T2C, 5T2C, 6T2C, and 7T2C.

The First Embodiment

Figure 4:
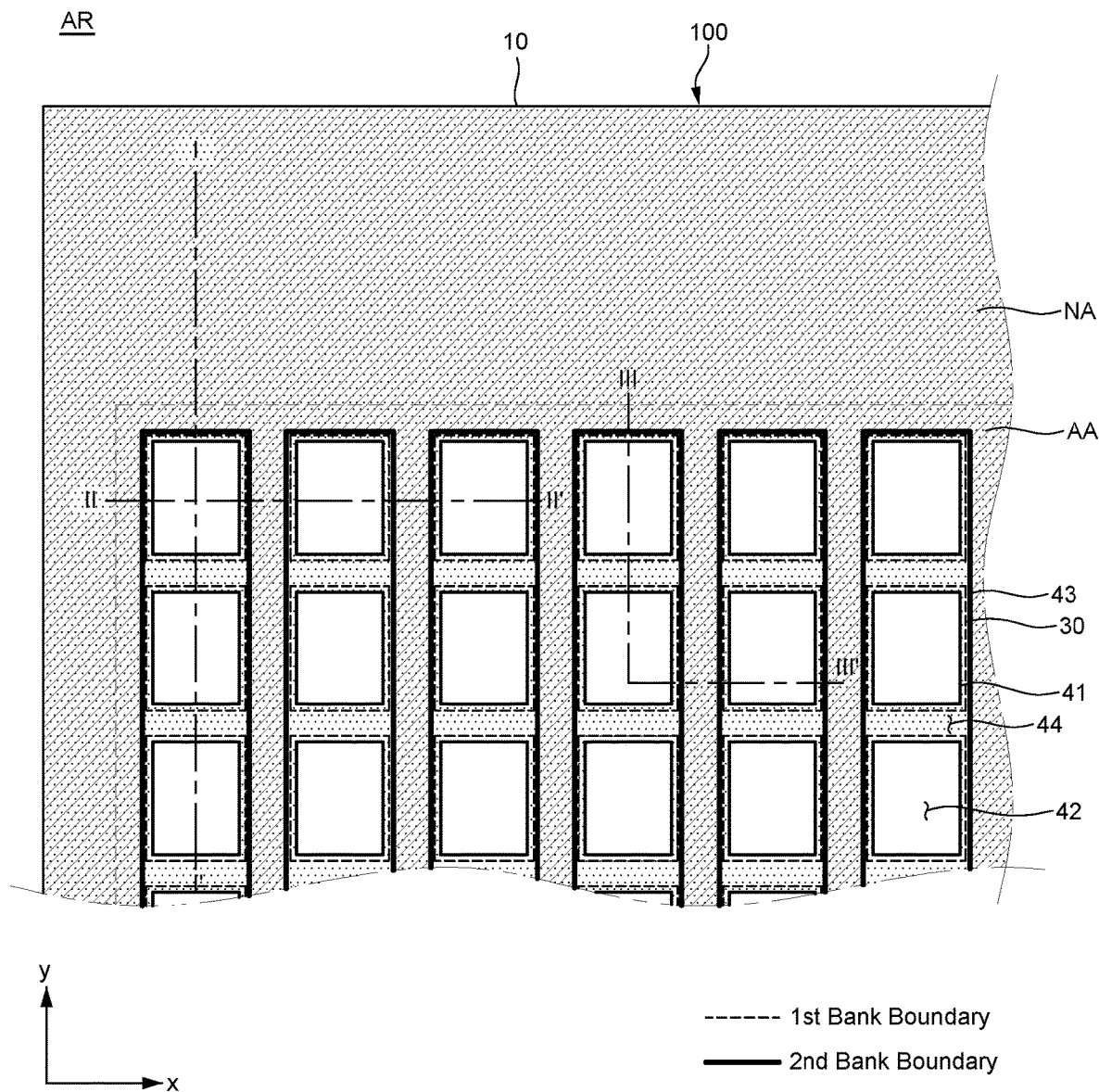
FIG. 4 is a partial plan view schematically showing an organic light emitting display device according to a first embodiment of the present disclosure.
Figure 5A:
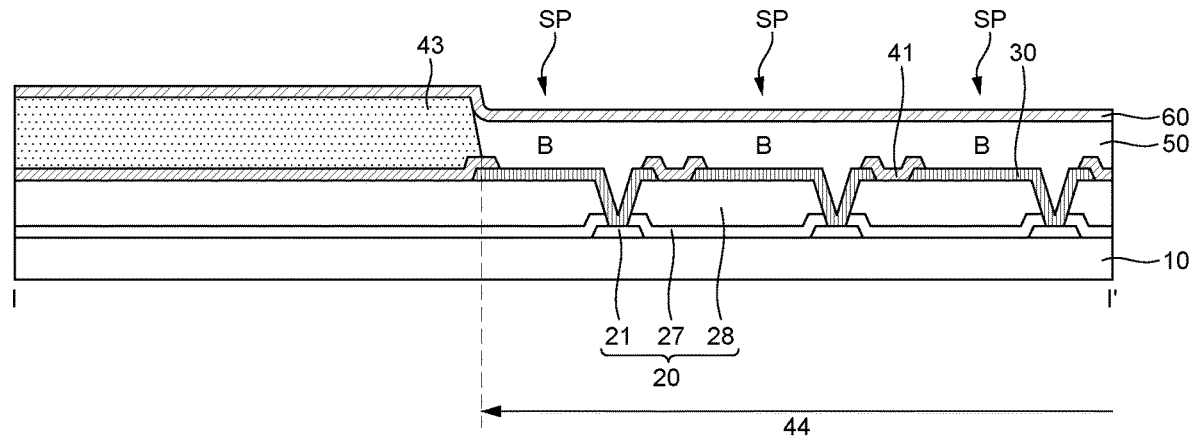
FIGS. 5A and 5B are cross-sectional views of FIG. 4 taken along lines I-I' and II-II', respectively according to one embodiment.
Figure 5B:
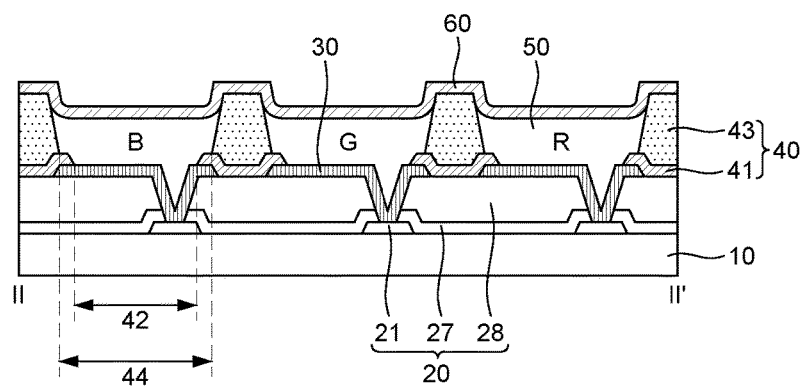

FIG. 4 is a partial schematic view of an organic light emitting display device according to a first embodiment of the present disclosure, and is an enlarged plan view of the AR area of FIG. 1. FIGS. 5A and 5B are cross-sectional views of FIG. 4 taken along lines I-I' and II-II', respectively.

Referring to FIGS. 4, 5A and 5B, the organic light emitting display device 100 according to the first exemplary embodiment of the present disclosure includes a substrate 10 including a display area AA in which sub-pixels SP are arranged and a non-display area NA disposed outside the display area AA. The substrate 10 may have various planar shapes. For example, as shown in the drawing, it may include any kind of planar shapes such as a square, a circle, and an oval as well as a rectangle. In the substrate 10, a first direction, for example, X-axis direction and a second direction, for example, Y-axis direction intersecting each other may be defined regardless of the planar shape of the substrate 10. Positions and arrangement relationships of sub-pixels and/or openings, which will be described later, may be defined by the first direction and the second direction.

On the substrate 10, a circuit element layer 20 and an organic light emitting diode driven by elements provided in the circuit element layer 20 are disposed.

In the circuit element layer 20, signal lines and electrodes for applying a driving signal to the organic light emitting diode may be arranged, and the signal lines and the electrodes may be separated with at least one insulating layer therebetween as necessary. When the organic light emitting display device is implemented in an active matrix AM method, the circuit element layer 20 may further include a thin film transistor 21 allocated for each sub-pixel SP. Hereinafter, for convenience of description, a case where a thin film transistor 21 is allocated for each sub-pixel will be described as an example. At this time, a passivation layer 27 and an overcoat layer 28 are interposed between the thin film transistor 21 and the organic light emitting diode. The passivation layer 27 includes an inorganic material and protects the internal element. The overcoat layer 28 includes a certain organic material, and is formed to have a predetermined thickness to compensate for a step difference caused by the thin film transistor 21 and signal lines formed thereunder.

The organic light emitting diode includes a first electrode 30, a second electrode 60, and an organic light emitting layer 50 interposed between the first electrode 30 and the second electrode 60. The first electrode 30 may be an anode, and the second electrode 60 may be a cathode.

More specifically, the sub-pixels SP may be arranged along the first direction and the second direction intersecting each other. Sub-pixels SP arranged adjacent to each other in the first direction may emit light of different colors, and the sub-pixels SP arranged adjacent to each other in the second direction may emit light of the same color. In the sub-pixels SP, the first electrode 30 of the organic light emitting diode is disposed. The first electrode 30 may be disposed in each of the sub-pixels SP.

On the first electrode 30, a bank 40 is disposed. The bank 40 includes a first bank 41 and a second bank 43.

The first bank 41 is positioned on the first electrode 30. The first bank 41 includes a first opening 42 exposing at least a portion of the first electrode 30. One first opening 42 exposes one first electrode 30. Therefore, the number of the first openings 42 and the number of the first electrodes 30 may correspond to each other.

The first bank 41 may be formed with a relatively thin thickness so that it can be covered by the organic light emitting layer 50. The first bank 41 may have hydrophilic properties. For example, the first bank 41 may be formed of a hydrophilic inorganic insulating material such as silicon oxide SiO2 or silicon nitride SiNx.

In the drawing, the case where the first opening 42 having an approximately rectangular shape is illustrated as an example, but is not limited thereto. In addition, although the first openings 42 are all illustrated to have the same shape and area, the present disclosure is not limited thereto, and at least one of the first openings 42 may have different shape and/or area from the other first opening 42. For example, the shape and/or area of the first opening 42 may be appropriately selected in consideration of the life-time of the organic light emitting material for forming the organic light emitting layer 50 of the organic light emitting diode. A portion of the first electrode 30 exposed by the first opening 42 may be defined as a light emitting region.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction to expose a plurality of first openings 42 disposed along the second direction.

The second bank 43 may have hydrophobic characteristics. Alternatively, the upper and side surfaces of the second bank 43 may have hydrophobic characteristics. For example, the second bank 43 may have a shape in which a material having a hydrophobic property is coated on the insulating material, and may be formed of an insulating material including a hydrophobic material. The second bank 43 may be made of an organic material. The hydrophobic property of the second bank 43 may function to push the organic light emitting material constituting the organic light emitting layer 50 to the central portion of the light emitting region. In addition, the second bank 43 may function as a barrier that traps the organic light emitting material dropped in the corresponding region so as to suppress the organic light emitting materials of different colors from being mixed with each other.

In the drawings, the case where the second opening 44 has an approximately rectangular shape is illustrated as an example, but is not limited thereto. In addition, although the second openings 44 are all illustrated to have the same shape and area, the present disclosure is not limited thereto, and at least one second opening 44 may have a different shape and/or area from the other second opening 44. For example, the shape and/or area of the second opening 44 may be appropriately selected in consideration of the life-time of the organic light emitting material.

The second opening 44 is spaced apart from the first opening 42. That is, the boundary of the first bank 41 is separated from the boundary of the second bank 43 by a predetermined interval. Accordingly, the first opening 42 may be exposed by the second opening 44.

On the substrate 10 on which the second bank 43 is formed, the organic light emitting layer 50 is positioned. The organic light emitting layer 50 may be formed in the corresponding second opening 44 along the extending direction of the second opening 44. That is, the organic light emitting material dropped on one second opening 44 covers the first electrodes 30 and the first banks 41 exposed by the second opening 44 and it is not physically separated by the first bank 41.

On the plurality of first electrodes 30 exposed by one second opening 44, an organic light emitting material of the same color is dropped. This means that light of the same color is emitted from a plurality of sub-pixels SP allocated to a position corresponding to one second opening 44. The planar shape of the organic light emitting layer 50 may correspond to the planar shape of the second opening 44.

The organic light emitting materials of different colors may be alternatively dropped on each of the corresponding second openings 44. The organic light emitting materials of different colors may include organic light emitting materials emitting red R, green G, and blue B, and if necessary, the organic light emitting materials emitting white W may be further included.

The second bank 43 is positioned between the first electrodes 30 neighboring in the first direction, thereby, the organic light emitting materials of different colors respectively dropped in the second openings 44 neighboring in the first direction are not mixed with each other. That is, the organic light emitting materials of different colors respectively dropped in the different second openings 44 are physically separated by the second bank 43.

The organic light emitting material, used to form the organic light emitting layer 50 during the solution process, is dropped so as to cover at least a portion of the first electrode 30, a portion of the first bank 41, and a portion of the second bank 43. The first bank 41 is a thin film of a hydrophilic element provided to suppress defects in wettability due to the hydrophobic characteristics of the first electrode 30, and can spread the hydrophilic organic light emitting material efficiently. The second bank 43 is a thick film with a hydrophobic characteristic, and allows the hydrophilic organic light emitting material to be pushed out to the center. Due to the combination structure of the first bank 41 and the second bank 43, the organic light emitting layer 50 may be formed in a relatively uniform thickness in the light emitting region.

In addition, when each of the second openings 44 are exposing one first electrode 30, the thickness of the organic light emitting material dropped in each of the second openings 44 can be different due to the equipment variation during the solution process. The equipment variation may mean a variation in discharge amount between nozzles of the inkjet equipment. That is, each of the nozzles used to drop the organic light emitting material on the second openings 44 may not have a constant discharge amount. In this case, the thickness of the organic light emitting material dropped on each the sub-pixel SP may be different depending on the position, through nozzles allocated one per sub-pixel SP.

According to the present disclosure, in one second opening 44, a plurality of sub-pixels SP may be allocated, and a plurality of nozzles corresponding to the number of sub-pixels SP may be allocated, therefore, the variation in the discharge amount between the nozzles can be compensated so that the thickness of the organic light emitting material dropped in the second openings 44 can be made uniform.

Accordingly, in the organic light emitting display device according to the present disclosure, decrease in uniformity of the organic light emitting layer 50 can be suppressed, the display quality due to the variation in the thickness of the organic light emitting layer 50 in the sub-pixel SP can be suppressed. In addition, by ensuring the uniformity of the organic light emitting layer 50, it is possible to suppress a defect in which the life-time of the device decreases or a dark spot occurs.

The predetermined interval between the above-described boundary of the first bank 41 and the boundary of the second bank 43 means a minimum distance capable of securing the thickness uniformity of the organic light emitting layer 50. Problems may occur when the boundary of the first bank 41 and the boundary of the second bank 43 are located closer than a predetermined interval, uniformity of the organic light emitting layer 50 cannot be secured or when the boundary of the first bank 41 and the boundary of the second bank 43 are located farther than a predetermined interval, the area of the first electrode 30 shielded by the first bank 41 increases and the aperture ratio decreases.

In the organic light emitting display device according to the present disclosure, since the second opening 44 of the second bank 43 extends along the second direction, the second bank 43 is not located between the neighboring sub-pixels SP in the second direction. Therefore, in the present disclosure, since the above-described positional constraints of the first bank 41 are relatively reduced, it is possible to not only improve the degree of freedom in design, but also to secure the light emitting region on the first electrode 30 widely. Accordingly, the present disclosure can provide an organic light emitting display device having improved design freedom and securing a sufficient aperture ratio.

In addition, in case of the high-resolution display device, the area of the sub-pixels SP is relatively reduced. In this case, as the organic light emitting material may not be dropped in the right position, a mixed color defect in which the organic light emitting layers 50 of different colors are mixed with each other may occur. The present disclosure has an advantage of improving color mixing defects due to the dropping area of the organic light emitting material can be sufficiently secured on the large second opening 44 corresponding to the plurality of sub-pixels SP.

Figure 6:
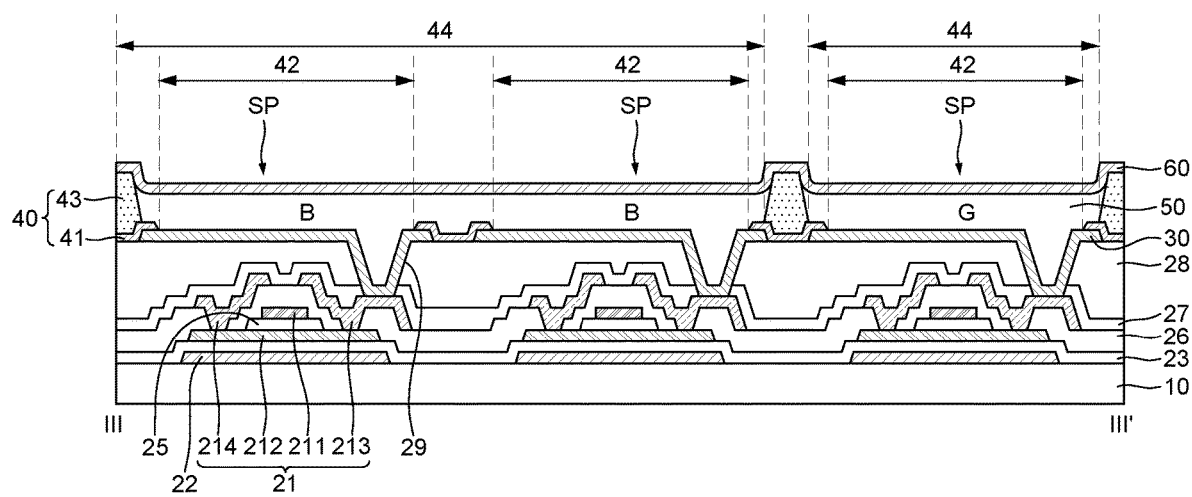
FIG. 6 is a cross-sectional view of FIG. 4 taken along line III-III' according to one embodiment.

FIG. 6 is a cross-sectional view of FIG. 4 taken along line III-III'.

Referring to FIG. 6, on the substrate 10, an organic light emitting diode disposed on a circuit element layer is disposed. The circuit element layer may include a thin film transistor 21 electrically connected to an organic light emitting diode. For example, a light blocking layer 22 is positioned on the substrate 10. The light blocking layer 22 blocks external light from entering so as to suppress photocurrent occurring in the transistor. A buffer layer 23 is positioned on the light blocking layer 22. The buffer layer 23 serves to protect the transistor formed in a subsequent process from impurities such as alkali-ions flowing out of the light blocking layer 22. The buffer layer 23 may be silicon oxide SiOx, silicon nitride SiNx, or multiple layers thereof.

The semiconductor layer 212 of the thin film transistor 21 is positioned on the buffer layer 23. The semiconductor layer 212 may be formed of a silicon semiconductor or an oxide semiconductor. The silicon semiconductor may include amorphous silicon or crystallized polycrystalline silicon. The semiconductor layer 212 includes a drain region and a source region including p-type or n-type impurities, and a channel region therebetween.

A gate insulating layer 25 is positioned on the semiconductor layer 212. The gate insulating layer 25 may be silicon oxide SiOx, silicon nitride SiNx, or multiple layers thereof. The gate electrode 211 is positioned on the gate insulating layer 25 in a predetermined region of the semiconductor layer 212, that is, a position corresponding to the channel region. The gate electrode 211 may be a single layer made of one among a group including molybdenum Mo, aluminum Al, chromium Cr, gold Au, titanium Ti, nickel Ni, neodymium Nd, copper Cu, and alloys thereof. In addition, the gate electrode 211 may be a multilayer made of at least two among a group including molybdenum Mo, aluminum Al, chromium Cr, gold Au, titanium Ti, nickel Ni, neodymium Nd, copper Cu and alloys thereof. For example, the gate electrode 211 may be a double layer of molybdenum/aluminum-neodymium or molybdenum/aluminum.

An interlayer insulating layer 26 that insulates the gate electrode 211 is positioned on the gate electrode 211. The interlayer insulating layer 26 may be a silicon oxide SiOx layer, a silicon nitride SiNx layer, or multiple layers thereof. The source electrode 213 and the drain electrode 214 are positioned on the interlayer insulating layer 26. The source electrode 213 and the drain electrode 214 are connected to the semiconductor layer 212 through contact holes exposing the source region and the drain region of the semiconductor layer 212. The source electrode 213 and the drain electrode 214 may be formed of a single layer or multiple layers, and when the source electrode 213 and the drain electrode 214 are single layers, they can be made of one among a group including molybdenum Mo, aluminum Al, and chromium Cr, gold Au, titanium Ti, nickel Ni, neodymium Nd, copper Cu, and alloys thereof. In addition, when the source electrode 213 and the drain electrode 214 are multi layered, it can be made of a double layer of molybdenum/aluminum-neodymium, a triple layer of titanium/aluminum/titanium, molybdenum/aluminum/molybdenum, or molybdenum/aluminum-neodymium/molybdenum. Accordingly, the thin film transistor 21 including the semiconductor layer 212, the gate electrode 211, the source electrode 213, and the drain electrode 214 is configured.

The passivation layer 27 is positioned on the substrate 10 including the thin film transistor 21. The passivation layer 27 is an insulating layer that protects the underlying element, and may be a silicon oxide layer SiOx, a silicon nitride layer SiNx, or multiple layers thereof. The overcoat layer 28 is positioned on the passivation layer 27. The overcoat layer 28 may be a flattening film for alleviating the step difference of the lower structure, and is made of organic materials such as polyimide, benzocyclobutene series resin, and acrylate. A sub-pixel contact hole 29 exposing the passivation layer 27 to expose the source electrode 213 is positioned in a portion of the overcoat layer 28.

An organic light emitting diode is formed on the overcoat layer 28. The organic light emitting diode includes the first electrode 30 connected to the thin film transistor, the second electrode 60 facing the first electrode 30, and the organic light emitting layer 50 interposed between the first electrode 30 and the second electrode 60. The first electrode 30 may be an anode electrode, and the second electrode 60 may be a cathode electrode.

The first electrode 30 is positioned on the overcoat layer 28 and may be connected to the source electrode 213 of the transistor through the sub-pixel contact hole 29 passing through the overcoat layer 28. The first electrode 30 may be allocated one per sub-pixel, but is not limited thereto. The first electrode 30 is made of a transparent conductive material such as Indium-Tin-Oxide (ITO), Indium-Zinc-Oxide (IZO), or Zinc-Oxide (ZnO) in response to the applied light emission method, and can function as a transparent electrode. In addition, a reflective layer functioning as a reflective electrode may be included. The reflective layer may be made of aluminum (Al), copper (Cu), silver (Ag), nickel (Ni), or alloys thereof, such as silver/palladium/copper APC alloy.

The bank 40 is disposed on the substrate 10 on which the first electrode 30 is formed. The bank 40 includes a first bank 41 and a second bank 43. The first bank 41 and the second bank 43 each include an opening exposing most of the first electrode 30.

The organic light emitting layer 50 is disposed on the substrate 10 on which the bank 40 is formed. The organic light emitting layer 50 includes an emission layer (EML) and may further include at least one among a hole injection layer (HIL), a hole transport layer (HTL), an electron transport layer (ETL), and an electron injection layer (EIL).

The first bank 41 includes a first opening 42 exposing a plurality of first electrodes 30 arranged in a row direction. The second bank 43 includes a second opening 44 exposing a plurality of first electrodes 30 arranged in a column direction.

The second electrode 60 is disposed on the organic light emitting layer 50. The second electrode 60 may be formed wide on the front surface of the substrate 10. The second electrode 60 may function as a transparent electrode or a reflective electrode in correspondence to the adopted light emission method. When the second electrode 60 is a transparent electrode, the second electrode 60 may be formed of a transparent conductive material such as Indium-Tin-Oxide ITO or Indium-Zinc-Oxide IZO. It may be made of magnesium (Mg), calcium (Ca), aluminum (Al), silver (Ag), or an alloy thereof having a thin thickness that is thin enough to transmit light.

Figure 7:
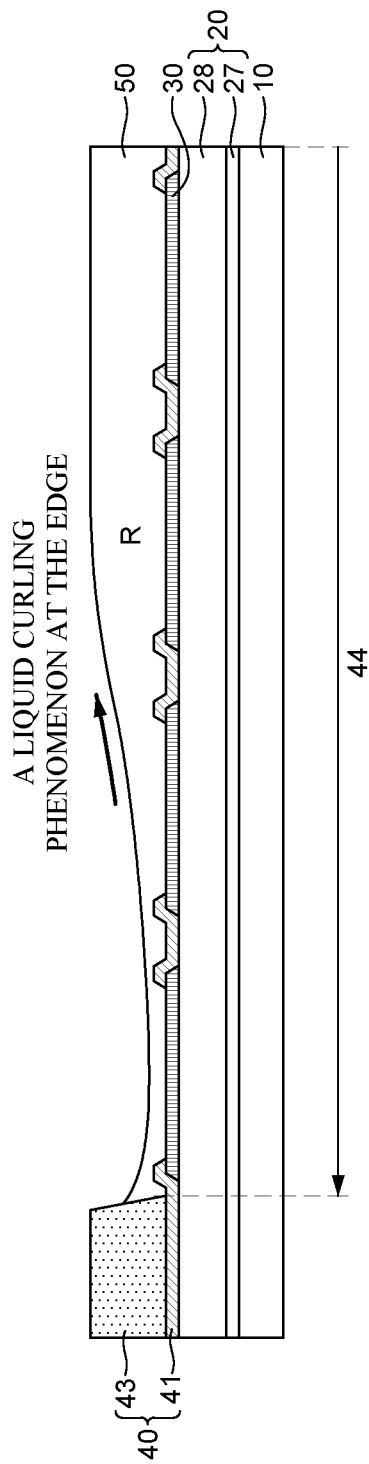
FIG. 7 is a view for explaining a liquid curling phenomenon at an edge according to one embodiment.

FIG. 7 is a view for explaining a liquid curling phenomenon at the edge.

Referring to FIG. 7, an organic light emitting material is dropped on the second opening 44. The dropped organic light emitting material can be widely spread to have a relatively uniform thickness in a large area. However, as illustrated, during the curing process of the organic light emitting material, the organic light emitting material may be gathered at the center of the display area, so an edge curling phenomenon in which the amount of the organic light emitting material is relatively reduced in the edge portion may occur. The edge portion means both ends of the second opening 44 in the second direction.

More specifically, the thickness of the organic light emitting layer 50 formed after the drying process is not uniform depending on the location, due to the nature of the organic light emitting material gathered in the central portion of the second opening 44, so a defect in which the thickness of the organic light emitting layer is thicker in the central portion where the organic light emitting materials are gathered and the thickness of the organic light emitting layer is thinner in the edge portion may occur.

That is, a gathering phenomenon in which the organic light emitting material moves from the edge portion toward the center portion occurs. Accordingly, an organic light emitting layer 50 having a thin thickness is formed at the edge portion, and an organic light emitting layer 50 having a thick thickness is formed at the center portion. This appears to the user as a difference in luminance between the edge portion and the center portion, which causes a problem that the display quality is deteriorated.

The Second Embodiment

Figure 8:
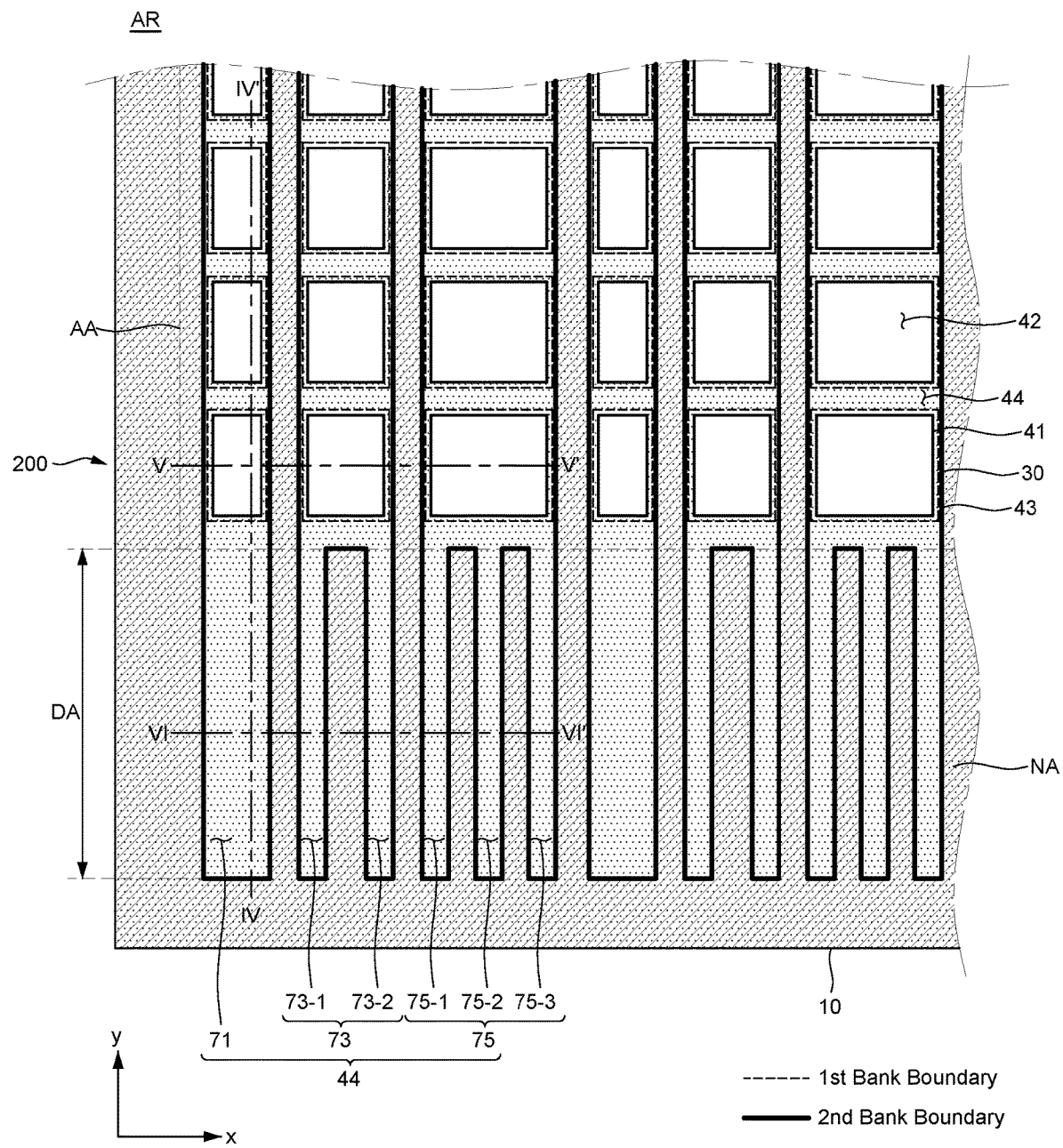
FIG. 8 is a partial plan view schematically showing an organic light emitting display device according to a second embodiment of the present disclosure.
Figure 9A:
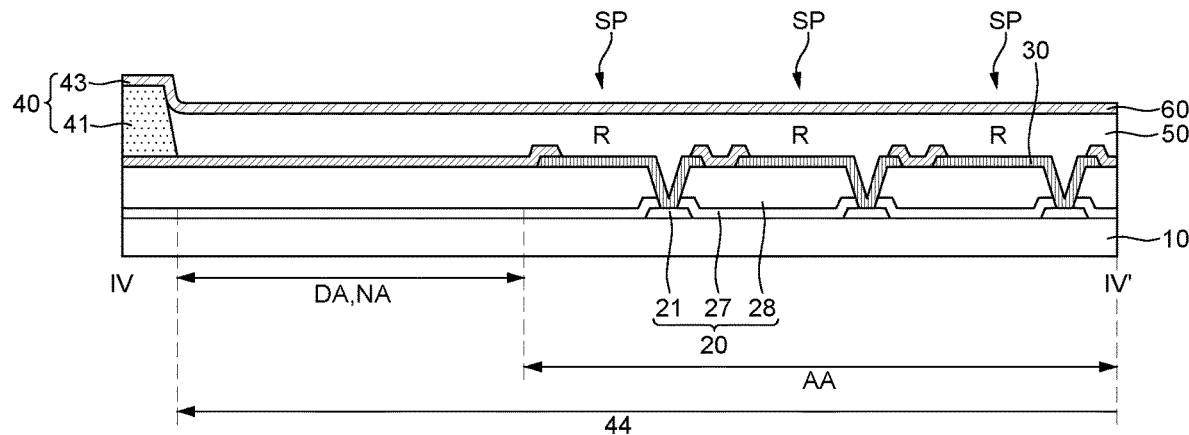
FIGS. 9A, 9B and 9C are cross-sectional views of FIG. 8 taken along lines IV-IV', V-V', and VI-VI', respectively according to one embodiment.
Figure 9B:
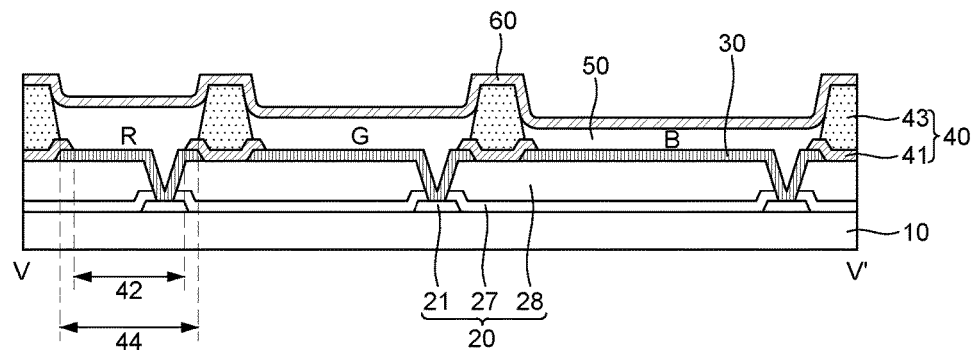
Figure 9C:
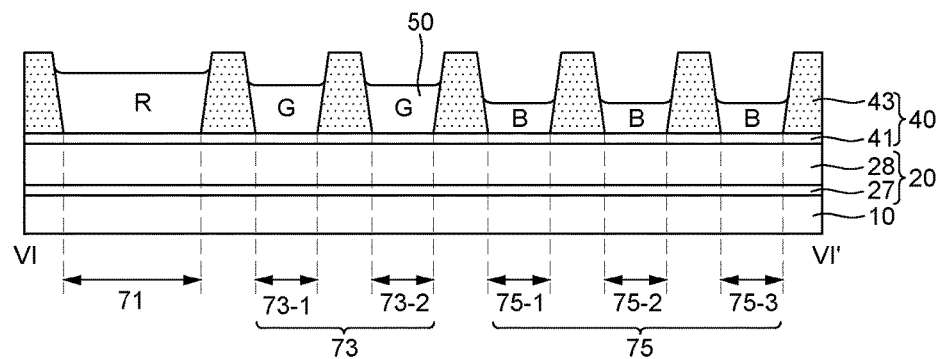
Figure 10:
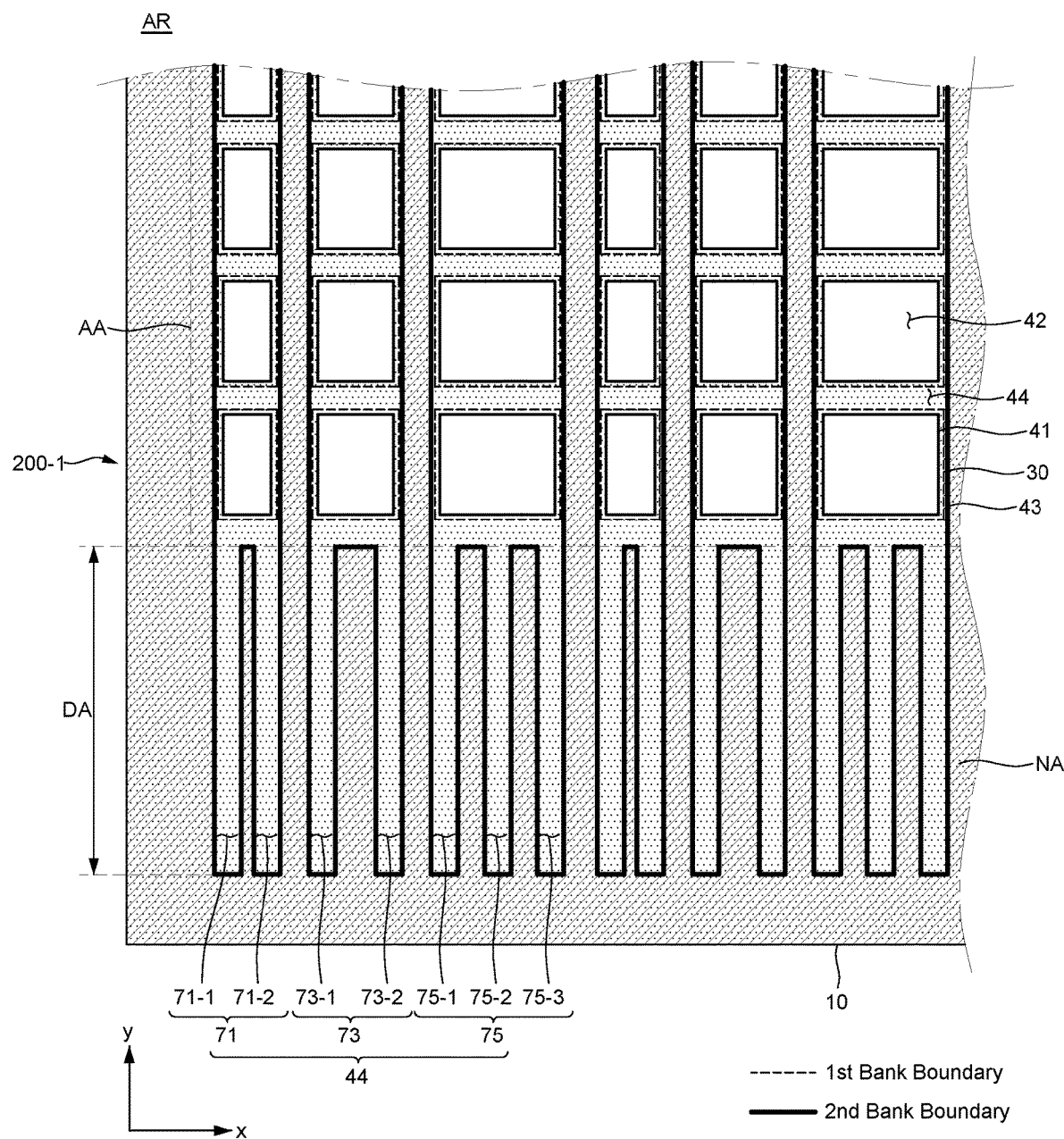
FIG. 10 is a partial plan view schematically showing another structure of the organic light emitting display device according to the second embodiment of the present disclosure.

FIG. 8 is a partial plan view schematically showing an organic light emitting display device according to a second embodiment of the present disclosure. FIGS. 9A, 9B and 9C are cross-sectional views of FIG. 8 taken along lines IV-IV', V-V', and VI-VI'. FIG. 10 is a partial plan view schematically showing another structure of the organic light emitting display device according to the second embodiment of the present disclosure.

Referring to FIGS. 8, 9A, 9B and 9C, the organic light emitting display device 100 according to the second embodiment of the present disclosure includes a substrate 10 including a display area AA in which sub-pixels SP are arranged and a non-display area NA disposed outside the display area AA. The substrate 10 may have various planar shapes. For example, as shown in the drawing, it may include any kind of planar shapes such as a square, a circle, and an oval as well as a rectangle. In the substrate 10, a first direction, for example, X-axis direction and a second direction, for example, Y-axis direction intersecting each other may be defined regardless of the planar shape of the substrate 10. Positions and arrangement relationships of sub-pixels and/or openings, which will be described later, may be defined by the first direction and the second direction.

On the substrate 10, the circuit element layer 20 and the organic light emitting diode driven by the elements provided in the circuit element layer 20 are disposed.

In the circuit element layer 20, signal lines and electrodes for applying a driving signal to the organic light emitting diode may be arranged, and the signal lines and the electrodes may be separated with at least one insulating layer therebetween as necessary. When the organic light emitting display device is implemented in an active matrix AM method, the circuit element layer 20 may further include a thin film transistor 21 allocated for each sub-pixel SP. Hereinafter, for convenience of description, a case where a thin film transistor 21 is allocated for each sub-pixel will be described as an example. At this time, the passivation layer 27 and the overcoat layer 28 are interposed between the thin film transistor 21 and the organic light emitting diode. The passivation layer 27 includes an inorganic material and protects the internal element. The overcoat layer 28 includes a certain organic material, and is formed to have a predetermined thickness to compensate for a step difference caused by the thin film transistor 21 and signal lines formed thereunder.

As illustrated in FIG. 9A, the overcoat layer 28 may be disposed in the display area AA and the non-display area NA. That is, the overcoat layer 28 may be continuously disposed over the entire display area AA and the non-display area NA.

The organic light emitting diode includes a first electrode 30, a second electrode 60, and an organic light emitting layer 50 interposed between the first electrode 30 and the second electrode 60. The first electrode 30 may be an anode, and the second electrode 60 may be a cathode.

More specifically, the sub-pixels SP may be arranged along a first direction and a second direction intersecting each other. Sub-pixels SP arranged adjacent to each other in the first direction may emit light of different colors, and the sub-pixels SP arranged adjacent to each other in the second direction may emit light of the same color. In the sub-pixels SP, the first electrode 30 of the organic light emitting diode is disposed. The first electrode 30 may be disposed in each of the sub-pixels SP.

On the first electrode 30, the bank 40 is disposed. The bank 40 includes a first bank 41 and a second bank 43.

The first bank 41 is positioned on the first electrode 30. The first bank 41 includes a first opening 42 exposing at least a portion of the first electrode 30. One first opening 42 exposes one first electrode 30. Therefore, the number of the first openings 42 and the number of the first electrodes 30 may correspond to each other.

The first bank 41 may be formed with a relatively thin thickness so that it can be covered by the organic light emitting layer 50. The first bank 41 may have hydrophilic properties. For example, the first bank 41 may be formed of a hydrophilic inorganic insulating material such as silicon oxide SiO2 or silicon nitride SiNx.

In the drawing, the case where the first opening 42 having an approximately rectangular shape is illustrated as an example, but is not limited thereto. In addition, although the first openings 42 are all illustrated to have the same shape and area, the present disclosure is not limited thereto, and at least one of the first openings 42 may have a different shape and/or area from the other first opening 42. For example, the shape and/or area of the first opening 42 may be appropriately selected in consideration of the life-time of the organic light emitting material for forming the organic light emitting layer 50 of the organic light emitting diode. A portion of the first electrode 30 exposed by the first opening 42 may be defined as a light emitting region.

The non-display area NA may further include a dummy area DA. The dummy area DA is an area adjacent to the display area AA in the second direction. The first bank 41 is disposed in the display area AA and extends to the dummy area DA. In the dummy area DA, an overcoat layer 28 is interposed between the first bank 41 and the substrate 10.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction to expose a plurality of first openings 42 disposed along the second direction.

The second bank 43 may have hydrophobic characteristics. For example, the second bank 43 may have a form in which a material having a hydrophobic property is coated on the insulating material, and may be formed of an insulating material containing a hydrophobic material. The second bank 43 may be made of an organic material. The hydrophobic property of the second bank 43 may serve to push the organic light emitting material constituting the organic light emitting layer 50 to the center of the light emitting region. In addition, the second bank 43 may function as a barrier that traps the organic light emitting material dropped in the corresponding region so as to suppress the organic light emitting materials of different colors from being mixed with each other.

In the drawings, the case where the second opening 44 has an approximately rectangular shape is illustrated as an example, but is not limited thereto. In addition, although the second openings 44 are all illustrated to have the same shape and area, the present disclosure is not limited thereto, and at least one second opening 44 may have a different shape and/or area from the other second opening 44. For example, the shape and/or area of the second opening 44 may be appropriately selected in consideration of the life-time of the organic light emitting material.

The second opening 44 is spaced apart from the first opening 42. That is, the boundary of the first bank 41 is separated from the boundary of the second bank 43 by a predetermined interval. Accordingly, the first opening 42 may be exposed by the second opening 44.

The second bank 43 is disposed in the display area AA and extends to the dummy area DA. The second opening 44 exposes the plurality of first electrodes 30 arranged in the display area AA, and extends to the dummy area DA to expose the first bank 41 disposed in the dummy area DA. The dummy area DA is an area of the non-display area NA in which a thin film transistor and an organic light emitting diode are not disposed. Therefore, the second opening 44 exposes only the first bank 41 in the dummy area DA. In the second embodiment of the present disclosure, by including the dummy area DA, the edge portion of the second opening 44 can be disposed in the non-display area AA.

On the substrate 10 on which the second bank 43 is formed, the organic light emitting layer 50 is positioned. The organic light emitting layer 50 may be formed in the corresponding second opening 44 along the extending direction of the second opening 44. That is, the organic light emitting material dropped on one second opening 44 covers the first electrodes 30 and the first banks 41 exposed by the second opening 44 and it is not physically separated by the first bank 41.

On the plurality of first electrodes 30 exposed by one second opening 44, an organic light emitting material of the same color is dropped. This means that light of the same color is emitted from a plurality of sub-pixels SP allocated to a position corresponding to one second opening 44. The planar shape of the organic light emitting layer 50 may correspond to the planar shape of the second opening 44.

The organic light emitting materials of different colors may be alternatively dropped on each of the corresponding second openings 44. The organic light emitting materials of different colors may include organic light emitting materials emitting red R, green G, and blue B, and if necessary, the organic light emitting materials emitting white W may be further included.

The second bank 43 is positioned between the first electrodes 30 neighboring in the first direction, thereby, the organic light emitting materials of different colors respectively dropped in the second openings 44 neighboring in the first direction are not mixed with each other. That is, the organic light emitting materials of different colors respectively dropped in the different second openings 44 are physically separated by the second bank 43.

In the second embodiment of the present disclosure, any one of the second openings 44 may be split into at least two or more branch lines in the non-display area NA.

Specifically, the second openings 44 include 2-1 openings 71, 2-2 openings 73, and 2-3 openings 75 including different organic light emitting layers 50. The 2-1 opening 71 is an area in which the organic light emitting layer 50 displaying any one color of the second openings 44 arranged in the second direction is formed. The 2-2 opening 73 is an area in which the organic light emitting layer 50, displaying a different color from the organic light emitting layer 50 formed in the 2-1 opening 71, is formed and is adjacently spaced apart from the 2-1 opening 71. The 2-3 opening 75 is adjacently spaced apart from the 2-2 opening 73 and the 2-3 opening 75 is an area in which the organic light emitting layer 50, displaying a different color from the organic light emitting layers 50 formed in the 2-1 opening 71 and the 2-2 opening 73, is formed.

The 2-1 opening 71 has a constant width and extends from the display area AA into the non-display area NA.

The 2-2 opening 73 extends from the display area AA into the non-display area NA, and is a region in which at least two second branch lines are branched. For example, the 2-2 opening 73 in the non-display area NA may include two second branch lines 73-1 and 73-2. The second branch lines 73-1 and 73-2 are disposed in the dummy area DA of the non-display area NA and have a width smaller than the width of the 2-2 opening 73 in the display area AA. The second branch lines 73-1 and 73-2 have a width smaller than the width of the 2-2 opening 73 in the display area AA, so that when the organic light emitting material is dropped and spread evenly, the capillary phenomenon acts so that the second branch lines 73-1 and 73-2 allow the organic light emitting material to move easily. In addition, since the second branch lines 73-1 and 73-2 are confined to the second bank 43, as described above, despite of the second bank 43 having a hydrophobic side, the second branch lines may serve to hold the organic light emitting material so that it does not gather at the central portion of the display device. That is, the second branch lines 73-1 and 73-2 may increase the effective area of the side surface of the second bank 43, that is, the area in which the organic light emitting material and the second bank 43 contact.

Accordingly, the second branch lines 73-1 and 73-2 included in the 2-2 opening 73 may serve to hold an organic light emitting material at an edge portion, that is, it holds the organic light emitting material so as not to gather from the dummy area DA to the center of the display area AA, and by generating a capillary phenomenon, it is possible to maintain the organic light emitting material in the dummy area DA to have a certain thickness.

Similarly, the 2-3 opening 75 is an area extending from the display area AA into the non-display area NA, and includes at least two or more branched third branch lines. For example, in the non-display area NA, the 2-3 opening 75 may include three third branch lines 75-1, 75-2, and 75-3. The third branch lines 75-1, 75-2 and 75-3 are disposed in the dummy area DA of the non-display area NA, and its width is smaller than the width of the 2-3 opening 75 in the display area AA. The third branch lines 75-1, 75-2, and 75-3 have a width smaller than the width of the 2-3 second opening 75 in the display area AA, and when the organic light emitting material is dropped and spread evenly, a capillary phenomenon acts to allow the organic light emitting material to move well through the third branch lines 75-1, 75-2, and 75-3. In addition, since the third branch lines 75-1, 75-2, and 75-3 are confined to the second bank 43, as described above, despite of the second bank 43 having a hydrophobic side, the third branch lines may serve to suppress the organic light emitting materials from gathering at the center of the display device.

In this embodiment, the 2-1 opening 71 is not split, and the 2-2 opening 73 and the 2-3 opening 75 may include branch lines split into two or more. The widths of the 2-1 opening 71, the 2-2 opening 73, and the 2-3 opening 75 may be different from each other. For example, a red light emitting layer may be formed in the 2-1 opening 71, a green light emitting layer may be formed in the 2-2 opening 73, and a blue light emitting layer may be formed in the 2-3 opening 75. At this time, the width of the second opening 44 in which the red light emitting layer is formed may be the smallest, the width of the second opening 44 in which the green light emitting layer is formed may be larger than the width of the second opening 44 in which the red light emitting layer is formed, and the width of the second opening 44 in which the blue light emitting layer is formed may be larger than the width of the second opening 44 in which the green light emitting layer is formed. The difference in width of each of the second openings 44 may be adjusted according to the light emitting characteristics of each light emitting layer.

The second opening 44 in which the red light emitting layer is formed has the narrowest width. A relatively large amount of the red organic light emitting material compared to its surface area may drop into the second opening 44 in which the red light emitting layer is formed, and thus the above-described liquid curling phenomenon at the edge portion can be almost suppressed. Therefore, a branch line may not be formed in the 2-1 opening 71 which is the second opening 44 in which the red light emitting layer is formed. However, as illustrated in FIG. 10, in the organic light emitting display device 200-1 according to the present disclosure, first branch lines 71-1 and 71-2 may be formed in the 2-1 opening 71 which is the second opening 44 in which the red light emitting layer is formed if necessary.

In addition, the second opening 44 in which the green light emitting layer is formed has a relatively larger width than the second opening 44 in which the red light emitting layer is formed. A relatively small amount of the green organic light emitting material compared to its surface area may drop into the second opening 44 in which the green light emitting layer is formed. Thus, the liquid curling phenomenon at the edge portion may occur relatively more. Therefore, at least two or more branch lines may be formed in the 2-2 opening 73 which is the second opening 44 in which the green light emitting layer is formed. For example, two branch lines 73-1 and 73-2 may be formed.

In addition, the second opening 44 in which the blue light emitting layer is formed has a relatively larger width than the second opening 44 in which the green light emitting layer is formed. A relatively small amount of the blue organic light emitting material compared to its surface area may drop into the second opening 44 in which the blue light emitting layer is formed. Thus, the liquid curling phenomenon at the edge portion may occur relatively more. Therefore, at least two or more branch lines may be formed in the 2-3 opening 75 which is the second opening 44 in which the blue light emitting layer is formed. For example, three branch lines 75-1, 75-2, and 75-3 may be formed. For example, the branch lines of the 2-2 opening 73 may be provided equal to or less than the number of branch lines of the 2-3 opening 75.

As shown in FIG. 9B, since the red organic light emitting material has a large amount compared to the surface area of the second opening 44 in which the red organic light emitting layer is formed, the thickness of the organic light emitting layer 50 after drying is thick. Since the green organic light emitting material has a smaller amount than the red organic light emitting material compared to the surface area of the second opening 44 in which the green organic light emitting layer is formed, the thickness of the green organic light emitting layer 50 after drying is formed to be thinner than the red organic light emitting layer. Since the blue organic light emitting material has a smaller amount than the green organic light emitting material compared to the surface area of the second opening 44 in which the blue organic light emitting layer is formed, the thickness of the blue organic light emitting layer 50 after drying is formed to be thinner than the green organic light emitting layer.

Accordingly, as shown in FIG. 9C, the thickness of the organic light emitting layer 50 formed in the 2-1 opening 71 is the thickest, the thickness of the organic light emitting layer 50 formed in the 2-2 opening 73 is formed to be thinner than the organic light emitting layer 50 formed in the 2-1 opening 71, and the thickness of the organic light emitting layer 50 formed in the 2-3 opening 75 is formed to be thinner than the organic light emitting layer 50 formed in the 2-2 opening 73.

As described in the first embodiment, during the curing process of the organic light emitting material, the organic light emitting material is gathered to the central portion of the display area, and the edge portion curling phenomenon in which the amount of the organic light emitting material is relatively reduced at the edge portion may occur. In the second embodiment of the present disclosure, by forming branch lines in the dummy area DA of the non-display area NA, the organic light emitting material is held so that the organic light emitting material does not gather from the edge portion, that is, the dummy area DA, to the center of the display area AA. In addition, by generating a capillary phenomenon, the organic light emitting material may be formed in the dummy area DA to have a predetermined thickness. Therefore, there is an advantage that the degradation of the display quality due to the thickness variation problem of the organic light emitting layer 50 according to the position can be remarkably improved.

The Third Embodiment

Figure 11:
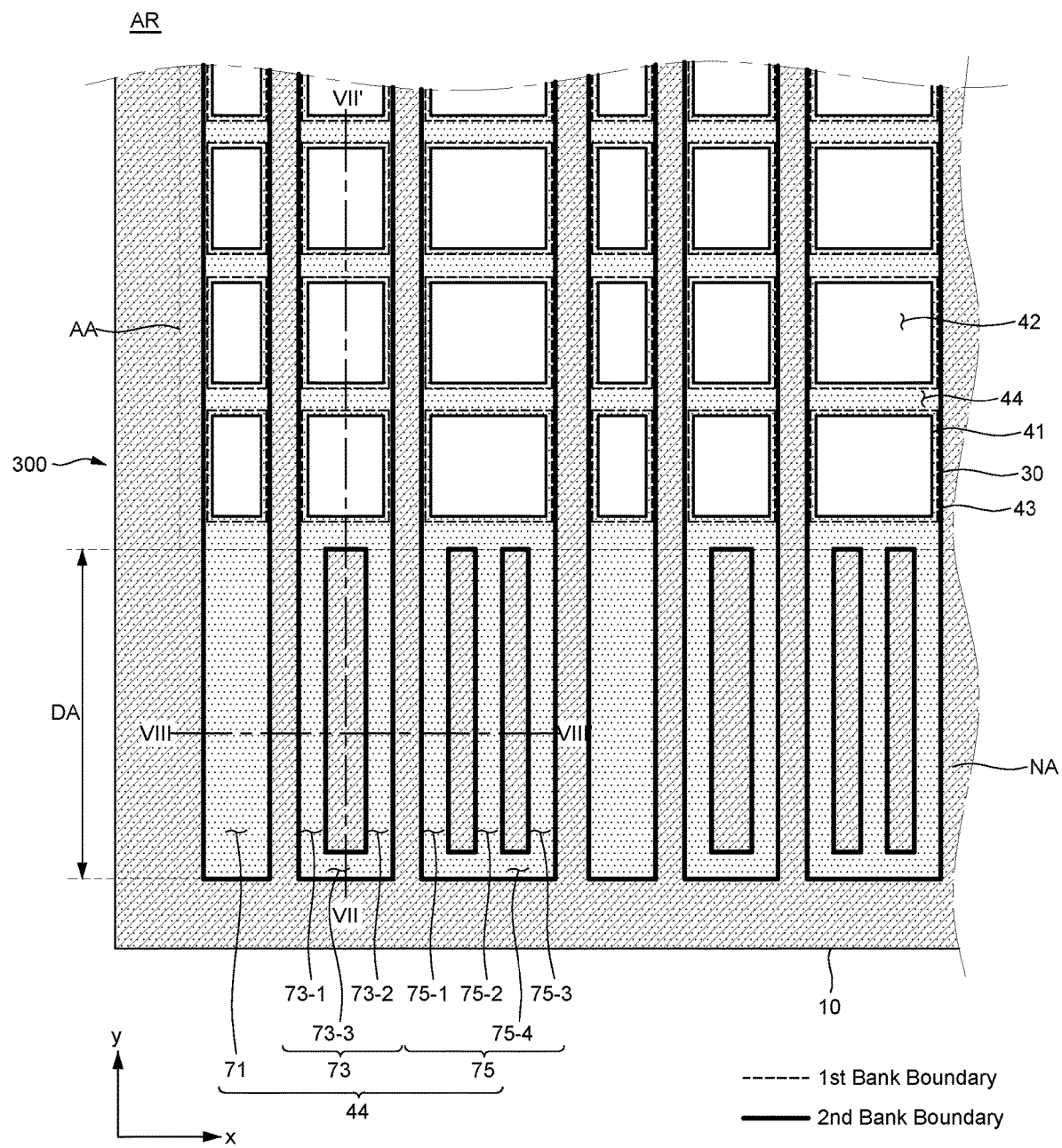
FIG. 11 is a partial plan view schematically showing an organic light emitting display device according to a third embodiment of the present disclosure.
Figure 12A:
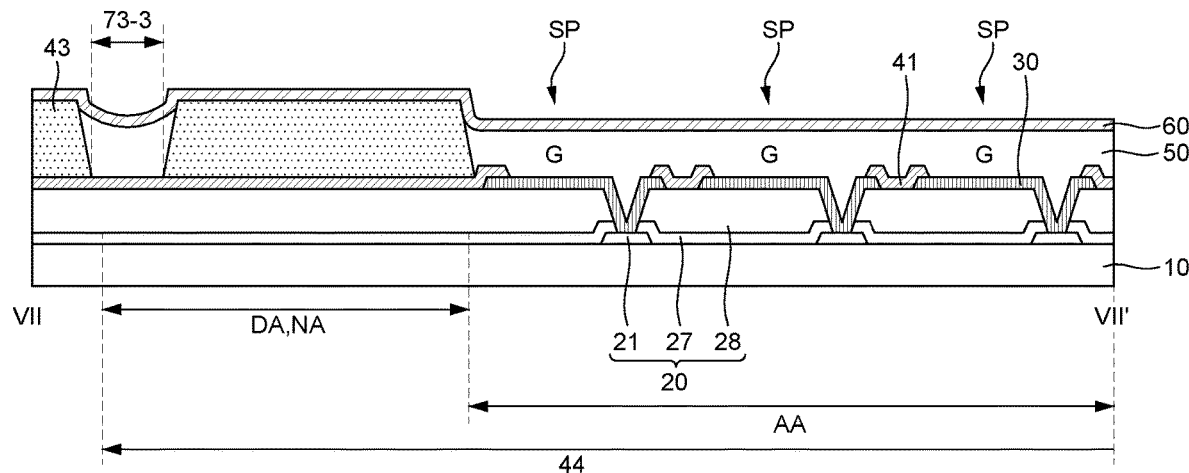
FIGS. 12A and 12B are cross-sectional views of FIG. 11 taken along lines VII-VII' and VIII-VIII', respectively according to one embodiment.
Figure 12B:
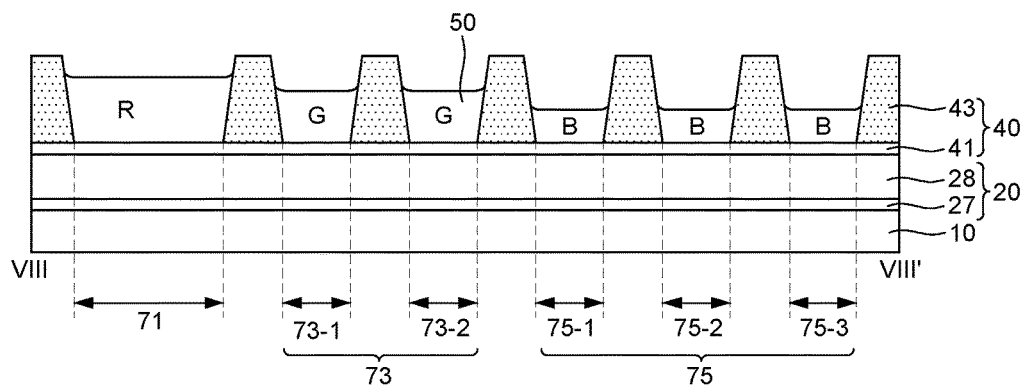

FIG. 11 is a partial schematic view of an organic light emitting display device according to a third embodiment of the present disclosure, and is an enlarged plan view of the AR area of FIG. 1. FIGS. 12A and 12B are cross-sectional views of FIG. 11 taken along lines VII-VII' and VIII-VIII'. In the following description, the same reference numerals are assigned to the same configuration as the above-described second embodiment, and the description thereof will be omitted or simplified.

Referring to FIGS. 11, 12A and 12B, the organic light emitting diode display device 300 according to the third embodiment includes a substrate 10 including a display area AA in which sub-pixels SP are arranged and a non-display area NA outside the display area AA. On the substrate 10, a circuit element layer 20 and an organic light emitting diode driven by elements provided in the circuit element layer 20 are disposed.

The circuit element layer 20 may further include a transistor 21 allocated for each sub-pixel SP when the organic light emitting display device 300 is implemented in an active matrix AM method. At this time, a passivation layer 27 and an overcoat layer 28 are interposed between the thin film transistor 21 and the organic light emitting diode.

As illustrated in FIG. 12A, the overcoat layer 28 may be disposed in the display area AA and the non-display area NA. That is, the overcoat layer 28 may be continuously disposed in the entire display area AA and the non-display area NA.

The organic light emitting diode includes a first electrode 30, a second electrode 60, and an organic light emitting layer 50 interposed between the first electrode 30 and the second electrode 60. The first electrode 30 may be an anode, and the second electrode 60 may be a cathode. On the first electrode 30, a bank 40 is disposed. The bank 40 includes a first bank 41 and a second bank 43.

The first bank 41 is positioned on the first electrode 30. The first bank 41 includes a first opening 42 exposing at least a portion of the first electrode 30. One first opening 42 exposes one first electrode 30. Therefore, the number of the first openings 42 and the number of the first electrodes 30 may correspond to each other. The non-display area NA may further include a dummy area DA. The dummy area DA is an area adjacent to the display area AA in the second direction. The first bank 41 is disposed in the display area AA and extends to the dummy area DA. In the dummy area DA, an overcoat layer 28 is interposed between the first bank 41 and the substrate 10.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction, exposing a plurality of the first openings 42 disposed along the second direction.

The second bank 43 is disposed in the display area AA and extends to the dummy area DA. The second opening 44 exposes the plurality of first electrodes 30 arranged in the display area AA, and extends to the dummy area DA to expose the first bank 41 disposed in the dummy area DA. The dummy area DA is an area of the non-display area NA in which a thin film transistor and an organic light emitting diode are not disposed. Therefore, the second opening 44 exposes only the first bank 41 in the dummy area DA. In the third embodiment of the present disclosure, by including the dummy area DA, the edge portion of the second opening 44 can be disposed in the non-display area AA.

The second bank 43 is on the substrate 10, so that the organic light emitting layer 50 is positioned. The organic light emitting layer 50 may be formed in the corresponding second opening 44 along the extending direction of the second opening 44. That is, the organic light emitting material dropped in one second opening 44 covers the first electrodes 30 and the first banks 41 exposed by the second opening 44, and is not physically separated by the first bank 41. The organic light emitting materials of different colors may be sequentially and alternately dropped in each of the corresponding second openings 44. The organic light emitting materials of different colors may include organic light emitting materials emitting red R, green G, and blue B, and if necessary, the organic light emitting materials emitting white W may be further included.

The second bank 43 is positioned between neighboring first electrodes 30 in the first direction, and thus, by the second bank 43, organic light emitting materials of different colors respectively dropped in the second openings 44 neighboring in the first direction are not mixed with each other. That is, the organic light emitting materials of different colors respectively dropped in the different second openings 44 are physically separated by the second bank 43.

In the third embodiment of the present disclosure, any one of the second openings 44 includes at least two branch lines in the non-display area NA, and ends of the branch lines may be connected to each other.

Specifically, the second openings 44 include 2-1 openings 71, 2-2 openings 73, and 2-3 openings 75 including different organic light emitting layers 50. The 2-1 opening 71 is an area in which the organic light emitting layer 50 displaying any one color of the second openings 44 arranged in the second direction is formed. The 2-2 opening 73 is adjacently spaced apart from the 2-1 opening 71, and is an area where the organic light emitting layer 50, having a different color from the organic light emitting layer 50 formed in the 2-1 opening 71, is formed. The 2-3 opening 75 is adjacently spaced apart from the 2-2 opening 73 and the organic light emitting layer 50 having a different color from the organic light emitting layers 50 formed in the 2-1 opening 71 and the 2-2 opening 73 is formed in the 2-3 opening 75.

The 2-1 opening 71 extends from the display area AA into the non-display area NA.

The 2-2 opening 73 is an area extending from the display area AA into the non-display area NA and including the second branch lines 73-1 and 73-2 in which at least two branches are formed. For example, the 2-2 opening 73 in the non-display area NA may include two second branch lines 73-1 and 73-2. The second branch lines 73-1 and 73-2, are disposed in the dummy area DA of the non-display area NA, are made smaller than the width of the 2-2 opening 73 in the display area AA. The second branch lines 73-1 and 73-2 have a width smaller than the width of the 2-2 opening 73 in the display area AA, so that when the organic light emitting material is dropped and spread evenly, the capillary phenomenon occurs so the organic light emitting material is moved well through the second branch lines 73-1 and 73-2. In addition, since the second branch lines 73-1 and 73-2 are confined to the second bank 43, as described above, despite of the second bank 43 having a side of hydrophobicity, the second branch lines may serve to hold the organic light emitting material so that it does not gather at the center of the display device. That is, the second branch lines 73-1 and 73-2 may increase the effective area of the side surface of the second bank 43, that is, the area where the organic light emitting material and the second bank 43 contact.

That is, the second branch lines 73-1 and 73-2 included in the 2-2 opening 73 hold the organic light emitting material so that the organic light emitting material does not gather from the edge portion, that is, the dummy area DA to the center of the display area AA and thus, by generating a capillary phenomenon, the organic light emitting material may be maintained in the dummy area DA to be formed to a certain thickness.

In the third embodiment, at ends of the second branch lines 73-1 and 73-2, for example, the second branch lines 73-1 and 73-2 may be connected to each other in an area adjacent to the outside of the substrate 10. As shown in FIG. 11, at the ends of the second branch lines 73-1 and 73-2, a second horizontal branch line 73-3 connecting them to each other is formed. The second horizontal branch line 73-3 connects the second branch lines 73-1 and 73-2 to each other, the effective area of the side surface of the second bank 43, that is, an area in which the organic light emitting material and the second bank 43 contact each other may be increased. Accordingly, the second horizontal branch line 73-3 may hold the organic light emitting material so that the organic light emitting material does not gather from the edge portion, that is, the dummy area DA to the center of the display area AA.

Similarly, the 2-3 opening 75 extends from the display area AA into the non-display area NA and the 2-3 opening 75 is an area where at least two or more third branch lines are formed. For example, the 2-3 opening 75 in the non-display area NA may include three third branch lines 75-1, 75-2 and 75-3. The third branch lines 75-1, 75-2 and 75-3 are disposed in the dummy area DA of the non-display area NA and the width of each third branch line is smaller than the width of the 2-3 opening 75 in the display area AA. The third branch lines 75-1, 75-2 and 75-3 are made smaller than the width of the 2-3 opening 75 in the display area AA. Therefore, when the organic light emitting material is dropped and spread evenly, a capillary phenomenon acts to allow the organic light emitting material to move well through the third branch lines 75-1, 75-2, and 75-3. In addition, since the third branch lines 75-1, 75-2, and 75-3 are confined to the second bank 43, as described above, despite of the second bank 43 having a side of hydrophobicity, the third branch lines may serve to hold the organic light emitting material so that it does not gather at the center of the display area AA.

In the third embodiment, at ends of the third branch lines 75-1, 75-2, 75-3, for example, in an area adjacent to the outside of the substrate 10, the third branch lines 75-1, 75-2, 75-3 can be connected to each other. As shown in FIG. 11, at the ends of the third branch lines 75-1, 75-2, and 75-3, a third horizontal branch line 75-4 connecting them to each other is formed. The third horizontal branch line 75-4 connects the third branch lines 75-1, 75-2, and 75-3 to each other, so that the effective area of the side surface of the second bank 43, that is, an area in which the organic light emitting material and the second bank 43 contact each other may be increased. Accordingly, the third horizontal branch line 75-4 may hold the organic light emitting material so that the organic light emitting material does not gather from the edge portion, that is, the dummy area DA to the center of the display area AA.

In this embodiment, the 2-1 opening 71 is not split, and the 2-2 opening 73 and the 2-3 opening 75 may include branch lines split into two or more. Each of the 2-1 opening 71, the 2-2 opening 73, and the 2-3 opening 75 can be made different in width. For example, a red light emitting layer is formed in the 2-1 opening 71, a green light emitting layer is formed in the 2-2 opening 73, and a blue light emitting layer may be formed in the 2-3 opening 75. At this time, the width of the second opening 44 in which the red light emitting layer is formed is the smallest, the width of the second opening 44 in which the green light emitting layer is formed is greater than the width of the second opening 44 in which the red light emitting layer is formed, and the width of the second opening 44 in which the blue light emitting layer is formed may be greater than the width of the second opening 44 in which the green light emitting layer is formed. The difference in the width of each of the second openings 44 may be adjusted according to the light emission characteristics of each light emitting layer.

The second opening 44 in which the red light emitting layer is formed has the narrowest width. A relatively large amount of the red organic light emitting material compared to its surface area may drop into the second opening 44 in which the red light emitting layer is formed. Accordingly, the above-mentioned edge portion liquid curling phenomenon hardly occurs. Therefore, a branch line may not be formed in the 2-1 opening 71 which is the second opening 44 in which the red light emitting layer is formed.

In addition, the second opening 44 in which the green light emitting layer is formed has a relatively larger width than the second opening 44 in which the red light emitting layer is formed. A relatively small amount of the green organic light emitting material compared to its surface area may drop into the second opening 44 in which the green light emitting layer is formed. Thus, the liquid curling phenomenon at the edge portion may occur relatively more. Accordingly, at least two or more branch lines may be formed in the 2-2 opening 73 which is the second opening 44 where the green light emitting layer is formed, for example, two branch lines 73-1 and 73-2 may be formed.

In addition, the second opening 44 in which the blue light emitting layer is formed has a relatively larger width than the second opening 44 in which the green light emitting layer is formed. A relatively small amount of the blue organic light emitting material compared to its surface area may drop into the second opening 44 in which the blue light emitting layer is formed. Thus, the liquid curling phenomenon at the edge portion may occur relatively more. Therefore, at least two or more branch lines may be formed in the 2-3 opening 75 which is the second opening 44 in which the blue light emitting layer is formed, for example, three branch lines 75-1, 75-2, and 75-3 may be formed. For example, the branch lines of the 2-2 opening 73 may be provided equal to or less than the number of branch lines of the 2-3 opening 75.

As described in the first embodiment described above, during the curing process of the organic light emitting material, the organic light emitting material gathers in the center of the display area, and thus, an edge curling phenomenon in which the amount of the organic light emitting material is relatively reduced in the edge portion may occur. In the third embodiment of the present disclosure, by forming branch lines in the dummy area DA of the non-display area NA, it can hold the organic light emitting material so that the organic light emitting material does not gather from the edge portion, that is, the dummy area DA to the center of the display area AA, and thus, the capillary phenomenon occurs, and the organic light emitting material may be maintained in the dummy area DA to be formed to a certain thickness. Further, by forming a horizontal branch line connecting the branch lines to each other, an area in which the organic light emitting material and the second bank 43 contact each other can be increased. Therefore, there is an advantage that the horizontal branch line can hold the organic light emitting material such that the organic light emitting material is not gathered from the edge portion, that is, the dummy area DA, to the central portion of the display area AA. Hence, there is an advantage that can significantly improve the degradation of the display quality due to the thickness variation of the organic light emitting layer 50 according to the position.

The Fourth Embodiment

Figure 13:
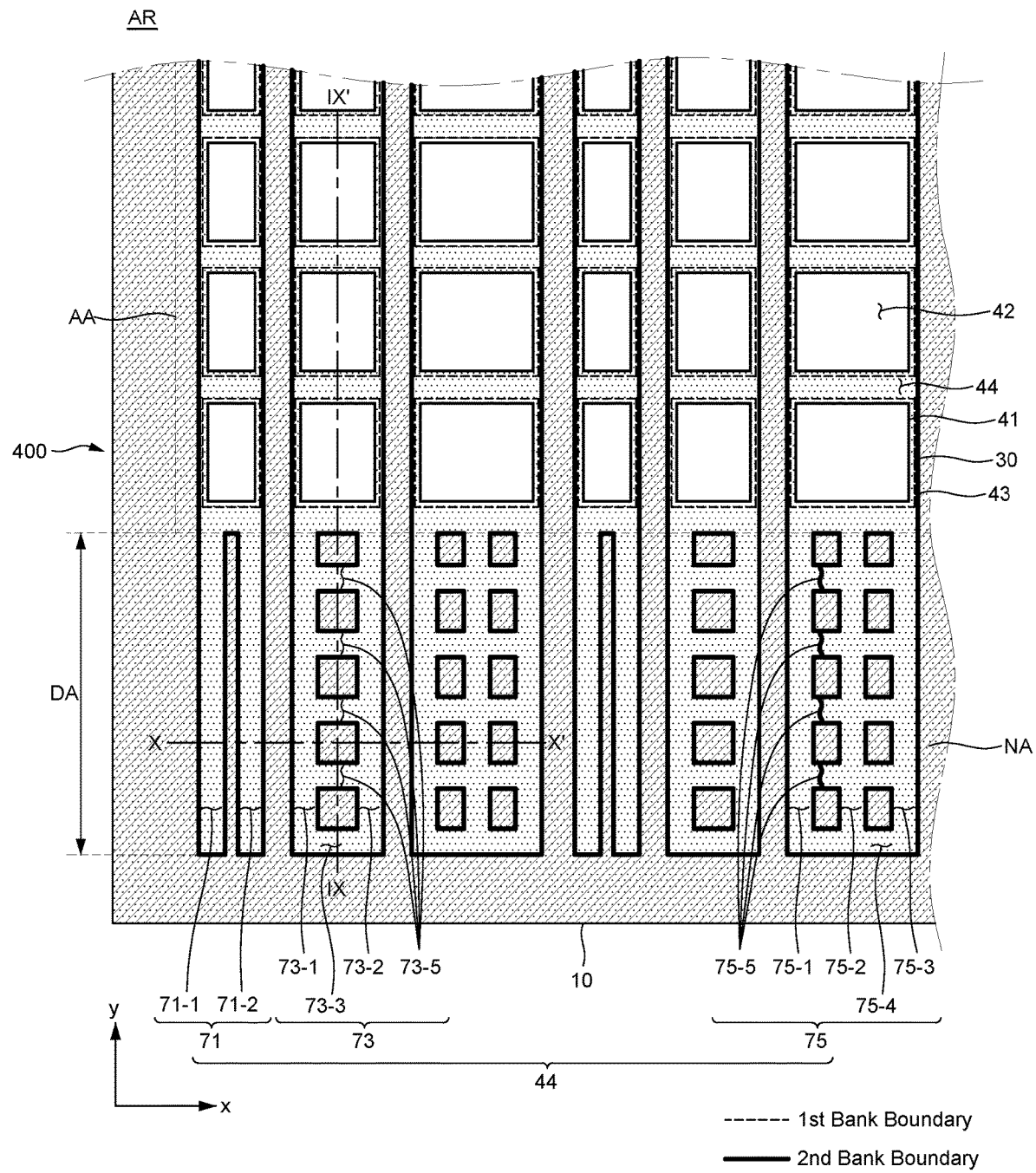
FIG. 13 is a partial plan view schematically showing an organic light emitting display device according to a fourth embodiment of the present disclosure.
Figure 14A:
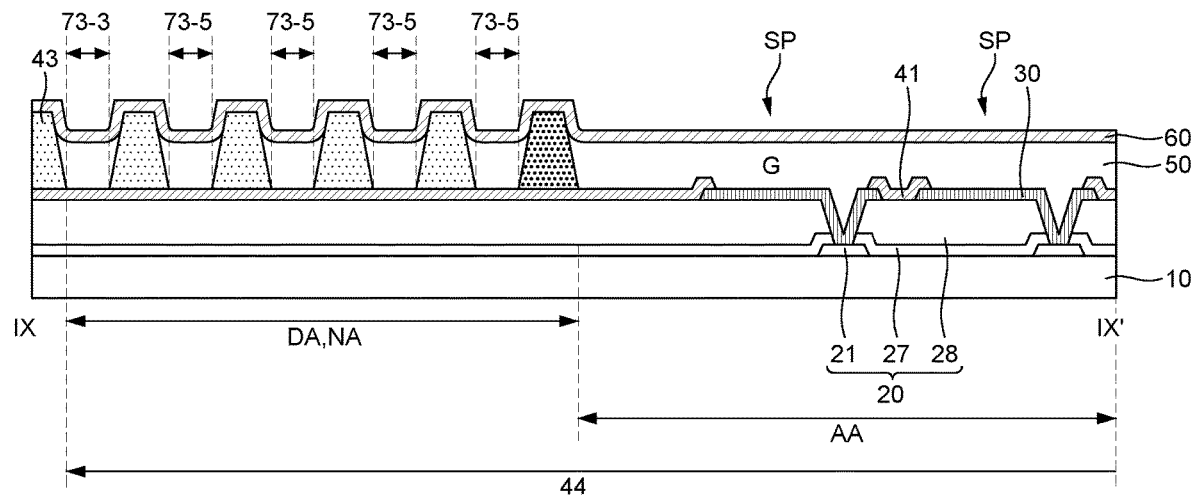
FIGS. 14A and 14B are cross-sectional views of FIG. 13 taken along lines VII-VII and III-III, respectively according to one embodiment.
Figure 14B:
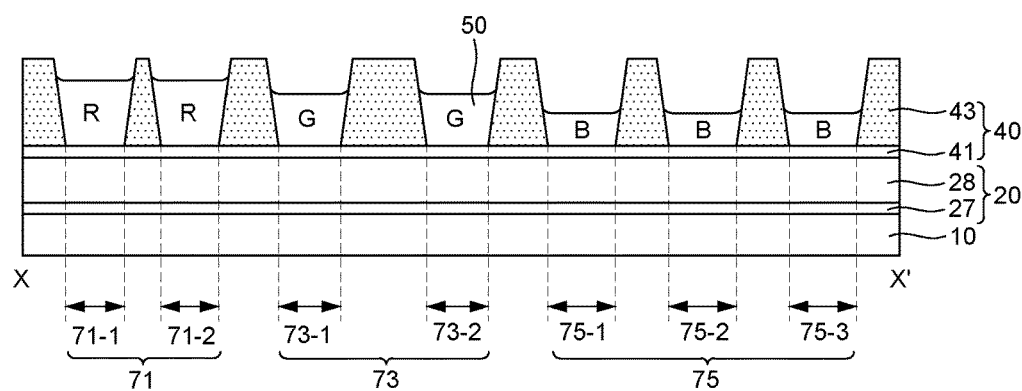

FIG. 13 is a partial schematic view of an organic light emitting display device according to a fourth exemplary embodiment of the present disclosure, and is an enlarged plan view of an AR area of FIG. 1. FIGS. 14A and 14B are cross-sectional views of FIG. 13 taken along lines IX-IX' and X-X. In the following description, the same reference numerals are assigned to the same configurations as the above-described second and third embodiments, and the description thereof will be omitted or simplified.

Referring to FIGS. 13, 14A and 14B, the organic light emitting diode display device 400 according to the fourth embodiment includes a substrate 10 including a display area AA in which sub-pixels SP are arranged and a non-display area NA outside the display area AA. On the substrate 10, a circuit element layer 20 and an organic light emitting diode driven by elements provided in the circuit element layer 20 are disposed.

The circuit element layer 20 may further include a transistor 21 allocated for each sub-pixel SP when the organic light emitting display device 300 is implemented in an active matrix AM method. At this time, the passivation layer 27 and the overcoat layer 28 are interposed between the thin film transistor 21 and the organic light emitting diode.

As illustrated in FIG. 14A, the overcoat layer 28 may be disposed in the display area AA and the non-display area NA. That is, the overcoat layer 28 may be continuously disposed in the entire display area AA and the non-display area NA.

The organic light emitting diode includes a first electrode 30, a second electrode 60, and an organic light emitting layer 50 interposed between the first electrode 30 and the second electrode 60. The first electrode 30 may be an anode, and the second electrode 60 may be a cathode. On the first electrode 30, a bank 40 is disposed. The bank 40 includes a first bank 41 and a second bank 43.

The first bank 41 is positioned on the first electrode 30. The first bank 41 includes a first opening 42 exposing at least a portion of the first electrode 30. One first opening 42 exposes one first electrode 30. Therefore, the number of the first openings 42 and the number of the first electrodes 30 may correspond to each other. The non-display area NA may further include a dummy area DA. The dummy area DA is an area adjacent to the display area AA in the second direction. The first bank 41 is disposed in the display area AA and extends to the dummy area DA. In the dummy area DA, an overcoat layer 28 is interposed between the first bank 41 and the substrate 10.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction, exposing a plurality of the first openings 42 disposed along the second direction.

The second bank 43 is disposed in the display area AA and extends to the dummy area DA. The second opening 44 exposes the plurality of first electrodes 30 arranged in the display area AA, and extends to the dummy area DA to expose the first bank 41 disposed in the dummy area DA. The dummy area DA is an area of the non-display area NA in which a thin film transistor and an organic light emitting diode are not disposed. Therefore, the second opening 44 exposes only the first bank 41 in the dummy area DA. In the fourth embodiment of the present disclosure, by including the dummy area DA, the edge portion of the second opening 44 can be disposed in the non-display area AA.

The second bank 43 is on the substrate 10, so that the organic light emitting layer 50 is positioned. The organic light emitting layer 50 may be formed in the corresponding second opening 44 along the extending direction of the second opening 44. That is, the organic light emitting material dropped in one second opening 44 covers the first electrodes 30 and the first banks 41 exposed by the second opening 44, and is not physically separated by the first bank 41. The organic light emitting materials of different colors may be sequentially and alternately dropped in each of the corresponding second openings 44. The organic light emitting materials of different colors may include organic light emitting materials emitting red R, green G, and blue B, and if necessary, the organic light emitting materials emitting white W may be further included.

The second bank 43 is positioned between neighboring first electrodes 30 in the first direction, and thus, by the second bank 43, organic light emitting materials of different colors respectively dropped in the second openings 44 neighboring in the first direction are not mixed with each other. That is, the organic light emitting materials of different colors respectively dropped in the different second openings 44 are physically separated by the second bank 43.

In the fourth embodiment of the present disclosure, in the non-display area NA, any one of the second openings 44 includes branch lines split into at least two or more, and the branch lines may be connected to each other.

Specifically, the second openings 44 include the 2-1 openings 71, the 2-2 openings 73, and the 2-3 openings 75 including different organic light emitting layers 50. The 2-1 opening 71 is an area in which the organic light emitting layer 50 displaying any one color of the second openings 44 arranged in the second direction is formed. The 2-2 opening 73 is adjacently spaced apart from the 2-1 opening 71, and is an area where the organic light emitting layer 50, having a different color from the organic light emitting layer 50 formed in the 2-1 opening 71, is formed. The 2-3 opening 75 is adjacently spaced apart from the 2-2 opening 73 and the organic light emitting layer 50 having a different color from the organic light emitting layers 50 formed in the 2-1 opening 71 and the 2-2 opening 73 is formed in the 2-3 opening 75.

The 2-1 opening 71 extends from the display area AA to the non-display area NA. The 2-1 opening 71 is an area extending from the display area AA into the non-display area NA and including the first branch lines in which at least two branches are formed. For example, the 2-1 opening 71 in the non-display area NA may include two first branch lines 71-1 and 71-2. The first branch lines 71-1 and 71-2, are disposed in the dummy area DA of the non-display area NA, are formed narrower than the width of the 2-1 opening 71 in the display area AA. The first branch lines 71-1 and 71-2 have a width narrower than the width of the 2-1 opening 71 in the display area AA, so that when the organic light emitting material is dropped and spread evenly, the capillary phenomenon occurs so the organic light emitting material is moved well through the first branch lines 71-1 and 71-2. In addition, since the first branch lines 71-1 and 71-2 are confined to the second bank 43, as described above, despite of the second bank 43 having a side of hydrophobicity, the first branch lines may serve to hold the organic light emitting material so that it does not gather at the center of the display area AA. That is, the first branch lines 71-1 and 71-2 may increase the effective area of the side surface of the second bank 43, that is, the area where the organic light emitting material and the second bank 43 contact.

On the other hand, the 2-2 opening 73 is an area extending from the display area AA into the non-display area NA and including the second branch lines in which at least two branches are formed. For example, the 2-2 opening 73 in the non-display area NA may include two second branch lines 73-1 and 73-2. The second branch lines 73-1 and 73-1, are disposed in the dummy area DA of the non-display area NA, are formed narrower than the width of the 2-2 opening 73 in the display area AA. The second branch lines 73-1 and 73-2 have a width narrower than the width of the 2-2 opening 73 in the display area AA, so that when the organic light emitting material is dropped and spread evenly, the capillary phenomenon occurs so the organic light emitting material is moved well through the second branch lines 73-1 and 73-2.

In addition, since the second branch lines 73-1 and 73-2 are confined to the second bank 43, as described above, despite of the second bank 43 having a side of hydrophobicity, the second branch lines may serve to hold the organic light emitting material so that it does not gather at the center of the display area AA. That is, the second branch lines 73-1 and 73-2 may increase the effective area of the side surface of the second bank 43, that is, the area where the organic light emitting material and the second bank 43 contact.

That is, the second branch lines 73-1 and 73-2 included in the 2-2 opening 73 hold the organic light emitting material so that the organic light emitting material does not gather from the edge portion, that is, the dummy area DA to the center of the display area AA and thus, by generating a capillary phenomenon, the organic light emitting material may be maintained in the dummy area DA to be formed to a certain thickness.

In the fourth embodiment, the second branch lines 73-1 and 73-2 may be connected to each other. As shown in FIG. 13, a plurality of second horizontal branch lines 73-5 connecting the second branch lines 73-1 and 73-2 are formed. The plurality of second horizontal branch lines 73-5 connect the second branch lines 73-1 and 73-2 to each other, such that the effective area of the side surface of the second bank 43, that is, an area in which the organic light emitting material and the second bank 43 contact each other may be increased. Accordingly, the second horizontal branch lines 73-5 may hold the organic light emitting material so that the organic light emitting material does not gather from the edge portion, that is, the dummy area DA to the center of the display area AA.

Similarly, the 2-3 opening 75 extends from the display area AA into the non-display area NA and the 2-3 opening 75 is an area where at least two or more third branch lines are formed. For example, the 2-3 opening 75 in the non-display area NA may include three third branch lines 75-1, 75-2 and 75-3. The third branch lines 75-1, 75-2 and 75-3 are disposed in the dummy area DA of the non-display area NA and the width of each third branch line is narrower than the width of the 2-3 opening 75 in the display area AA. The third branch lines 75-1, 75-2 and 75-3 are made narrower than the width of the 2-3 opening 75 in the display area AA. Therefore, when the organic light emitting material is dropped and spread evenly, a capillary phenomenon acts to allow the organic light emitting material to move well through the third branch lines 75-1, 75-2, and 75-3. In addition, since the third branch lines 75-1, 75-2, and 75-3 are confined to the second bank 43, as described above, despite of the second bank 43 having a side of hydrophobicity, the third branch lines may serve to hold the organic light emitting material so that it does not gather at the center of the display device.

In the fourth embodiment, the third branch lines 75-1, 75-2, 75-3 can be connected to each other. As shown in FIG. 13, a plurality of third horizontal branch lines 75-5, connecting the third branch lines 75-1, 75-2, and 75-3 to each other, is formed. The plurality of third horizontal branch lines 75-5 connects the third branch lines 75-1, 75-2, and 75-3 to each other, so that the effective area of the side surface of the second bank 43, that is, an area in which the organic light emitting material and the second bank 43 contact each other may be increased. Accordingly, the third horizontal branch lines 75-5 may hold the organic light emitting material so that the organic light emitting material does not gather from the edge portion, that is, the dummy area DA to the center of the display area AA.

In this embodiment, the 2-1 opening 71, the 2-2 opening 73, and the 2-3 opening 75 may include branch lines diverged into two or more. Each of the 2-1 opening 71, the 2-2 opening 73, and the 2-3 opening 75 can be made different in width. For example, a red light emitting layer is formed in the 2-1 opening 71, a green light emitting layer is formed in the 2-2 opening 73, and a blue light emitting layer may be formed in the 2-3 opening 75. At this time, the width of the second opening 44 in which the red light emitting layer is formed is the smallest, the width of the second opening 44 in which the green light emitting layer is formed is greater than the width of the second opening 44 in which the red light emitting layer is formed, and the width of the second opening 44 in which the blue light emitting layer is formed may be greater than the width of the second opening 44 in which the green light emitting layer is formed. The difference in the width of each of the second openings 44 may be adjusted according to the light emission characteristics of each light emitting layer.

The second opening 44 in which the red light emitting layer is formed has the narrowest width. A relatively large amount of the red organic light emitting material compared to its surface area may drop into the second opening 44 in which the red light emitting layer is formed. Accordingly, the above-mentioned edge portion liquid curling phenomenon hardly occurs. Therefore, a horizontal branch line may not be formed in the 2-1 opening 71 which is the second opening 44 in which the red light emitting layer is formed.

In addition, the second opening 44 in which the green light emitting layer is formed has a relatively larger width than the second opening 44 in which the red light emitting layer is formed. A relatively small amount of the green organic light emitting material compared to its surface area may drop into the second opening 44 in which the green light emitting layer is formed. Thus, the liquid curling phenomenon at the edge portion may occur relatively more. Accordingly, at least two or more branch lines may be formed in the 2-2 opening 73 which is the second opening 44 in which the green light emitting layer is formed, and a plurality of second horizontal branch lines 73-5 may be formed.

In addition, the second opening 44 in which the blue light emitting layer is formed has a relatively larger width than the second opening 44 in which the green light emitting layer is formed. A relatively small amount of the blue organic light emitting material compared to its surface area may drop into the second opening 44 in which the blue light emitting layer is formed. Thus, the liquid curling phenomenon at the edge portion may occur relatively more. Accordingly, at least two or more branch lines may be formed in the 2-3 opening 75 which is the second opening 44 in which the blue light emitting layer is formed, and a plurality of third horizontal branch lines 75-5 may be formed.

As described in the first embodiment described above, during the curing process of the organic light emitting material, the organic light emitting material gathers in the center of the display area, and thus, an edge curling phenomenon in which the amount of the organic light emitting material is relatively reduced in the edge portion may occur. In the fourth embodiment of the present disclosure, by forming branch lines in the dummy area DA of the non-display area NA, it can hold the organic light emitting material so that the organic light emitting material does not gather from the edge portion, that is, the dummy area DA to the center of the display area AA, and thus, the capillary phenomenon occurs, and the organic light emitting material may be maintained in the dummy area DA to be formed to a certain thickness. Further, by forming a plurality of horizontal branch lines connecting the branch lines to each other, an area in which the organic light emitting material and the second bank 43 contact each other can be increased. Therefore, there is an advantage that the horizontal branch lines can hold the organic light emitting material such that the organic light emitting material is not gathered from the edge portion, that is, the dummy area DA, to the central portion of the display area AA. Hence, there is an advantage that can significantly improve the degradation of the display quality due to the thickness variation of the organic light emitting layer 50 according to the position.

The Fifth Embodiment

Figure 15:
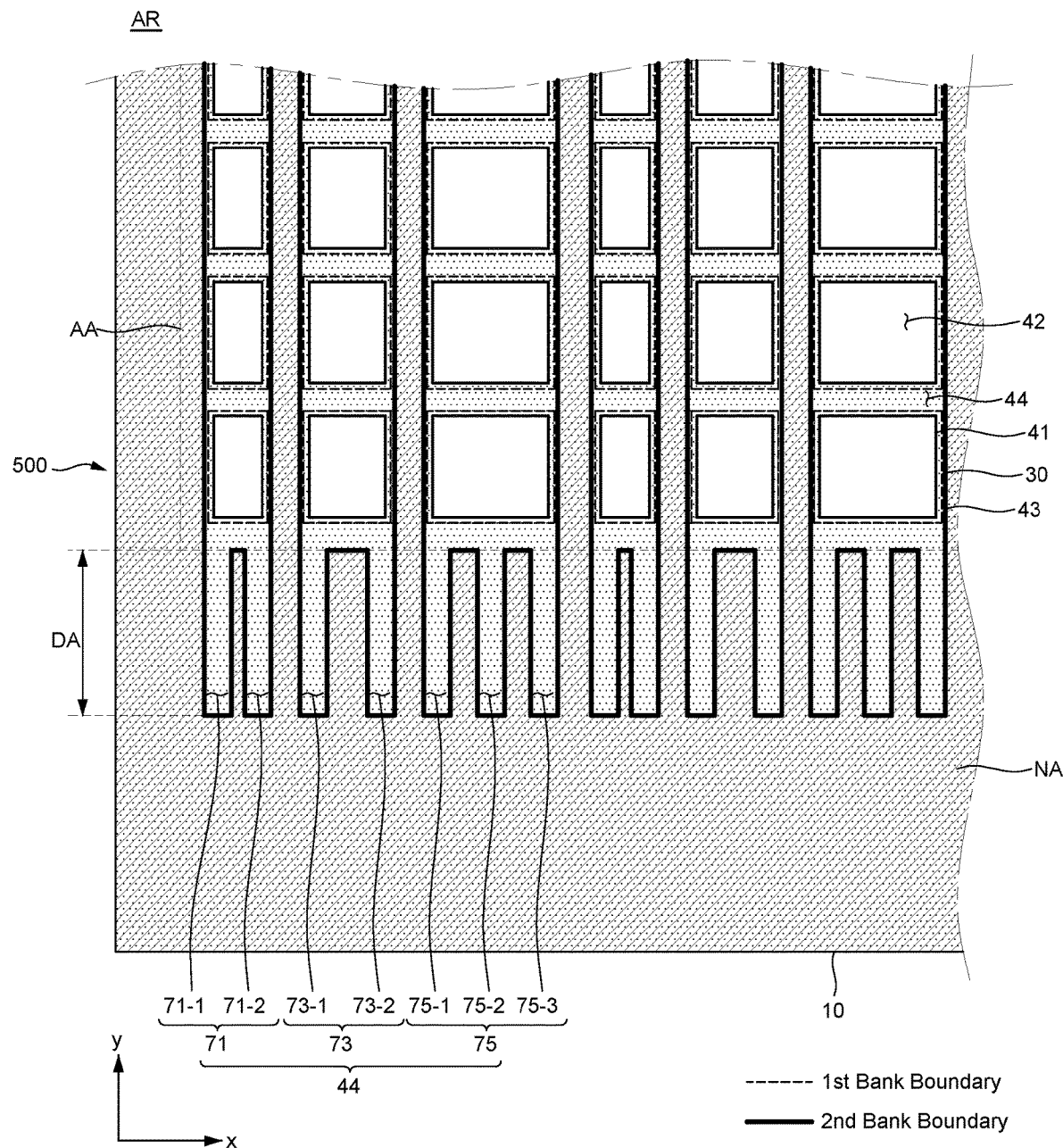
FIGS. 15 and 16 are partial plan views schematically showing an organic light emitting display device according to a fifth embodiment of the present disclosure.
Figure 16:
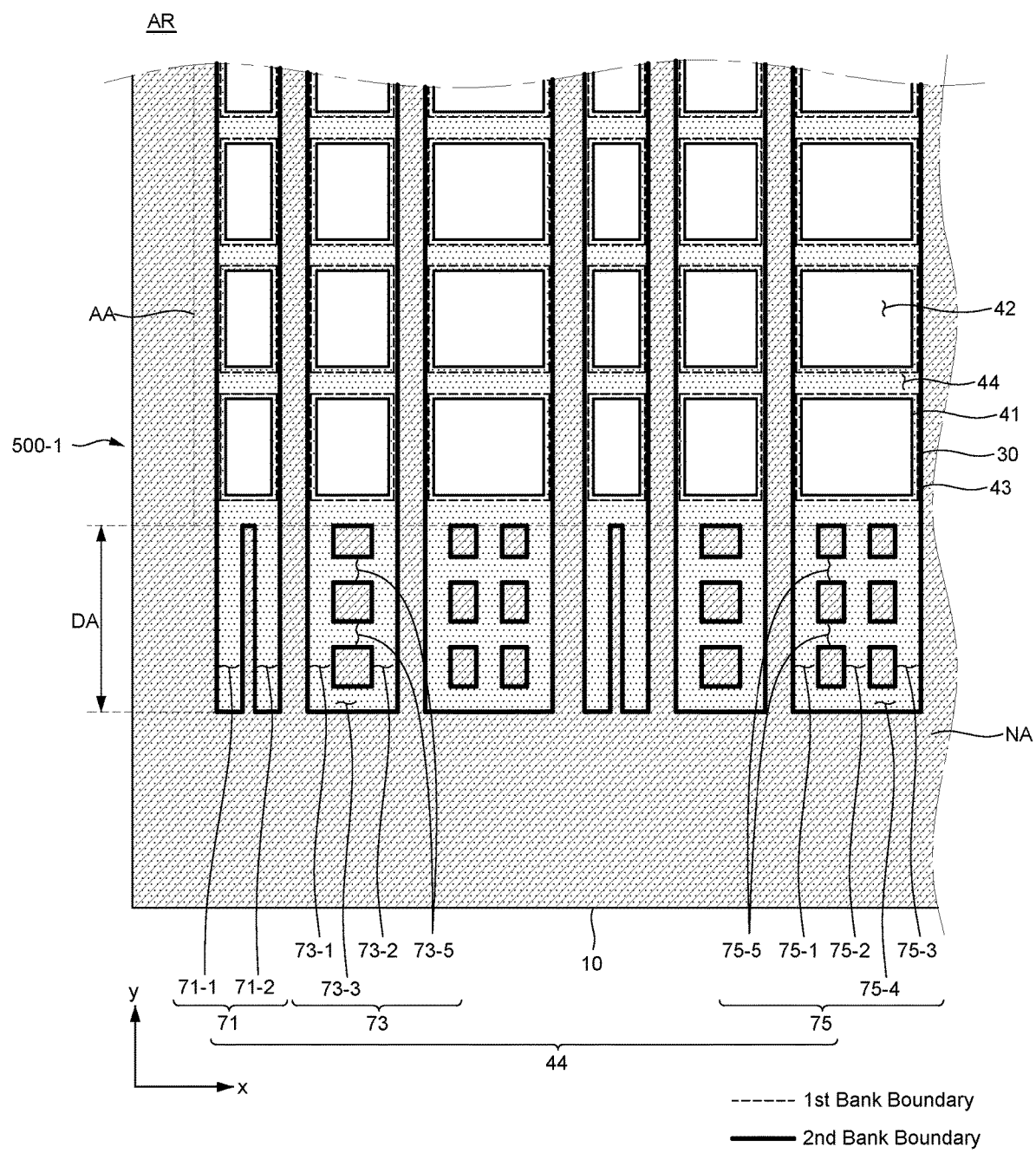

FIGS. 15 and 16 schematically show an organic light emitting display device according to a fifth embodiment of the present disclosure, and are enlarged partial plan views of the AR area of FIG. 1, respectively. In the following description, the same reference numerals are assigned to the same configurations as the above-described second and third embodiments, and the description thereof will be omitted or simplified.

Referring to FIG. 15, the organic light emitting diode display device 500 according to the fifth embodiment includes a substrate 10 including a display area AA in which sub-pixels SP are arranged and a non-display area NA outside the display area AA. On the substrate 10, the first electrode 30 is allocated for each sub-pixel SP. On the first electrode 30, a bank 40 is disposed. The bank 40 includes a first bank 41 and a second bank 43.

The first bank 41 is positioned on the first electrode 30. The first bank 41 includes a first opening 42 exposing at least a portion of the first electrode 30. One first opening 42 exposes one first electrode 30. Therefore, the number of the first openings 42 and the number of the first electrodes 30 may correspond to each other. The non-display area NA may further include a dummy area DA. The dummy area DA is an area adjacent to the display area AA in the second direction. The first bank 41 is disposed in the display area AA and extends to the dummy area DA. In the dummy area DA, an overcoat layer 28 is interposed between the first bank 41 and the substrate 10.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction, exposing a plurality of first openings 42 disposed along the second direction.

The second bank 43 is disposed in the display area AA and extends to the dummy area DA. The second opening 44 exposes the plurality of first electrodes 30 arranged in the display area AA, and extends to the dummy area DA to expose the first bank 41 disposed in the dummy area DA. The dummy area DA is an area of the non-display area NA in which a thin film transistor and an organic light emitting diode are not disposed. Therefore, the second opening 44 exposes only the first bank 41 in the dummy area DA. In the fifth embodiment of the present disclosure, by including the dummy area DA, the edge portion of the second opening 44 can be disposed in the non-display area AA.

The second bank 43 is positioned between neighboring first electrodes 30 in the first direction, and thus, by the second bank 43, organic light emitting materials of different colors respectively dropped in the second openings 44 neighboring in the first direction are not mixed with each other. That is, the organic light emitting materials of different colors respectively dropped in the different second openings 44 are physically separated by the second bank 43.

In the fifth embodiment of the present disclosure, in the non-display area NA, any one of the second openings 44 includes branch lines split into at least two or more, or the branch lines may be connected to each other.

Specifically, the second openings 44 include the 2-1 openings 71, the 2-2 openings 73, and the 2-3 openings 75 including different organic light emitting layers 50. The 2-1 opening 71 is an area in which the organic light emitting layer displaying any one color of the second openings 44 arranged in the second direction is formed. The 2-2 opening 73 is adjacently spaced apart from the 2-1 opening 71, and is an area where the organic light emitting layer 50, having a different color from the organic light emitting layer 50 formed in the 2-1 opening 71, is formed. The 2-2 opening 73 is adjacently spaced apart from the 2-1 opening 71 and the organic light emitting layer 50 having a different color from the organic light emitting layer is formed in the 2-1 opening 71. The 2-3 opening 75 is adjacently spaced apart from the 2-2 opening 73 and the organic light emitting layer having a different color from the organic light emitting layers formed in the 2-1 opening 71 and the 2-2 opening 73 is formed in the 2-3 opening 75.

The 2-1 opening 71 extends from the display area AA to the non-display area NA. The 2-1 opening 71 is an area extending from the display area AA into the non-display area NA and including the first branch lines in which at least two branches are formed. For example, the 2-1 opening 71 in the non-display area NA may include two first branch lines 71-1 and 71-2. The first branch lines 71-1 and 71-2, are disposed in the dummy area DA of the non-display area NA, are formed narrower than the width of the 2-1 opening 71 in the display area AA. The first branch lines 71-1 and 71-2 have a width narrower than the width of the 2-1 opening 71 in the display area AA, so that when the organic light emitting material is dropped and spread evenly, the capillary phenomenon occurs so the organic light emitting material is moved well through the first branch lines 71-1 and 71-2. In addition, since the first branch lines 71-1 and 71-2 are confined to the second bank 43, as described above, despite of the second bank 43 having a side of hydrophobicity, the first branch lines may serve to hold the organic light emitting material so that it does not gather at the center of the display area AA. That is, the first branch lines 71-1 and 71-2 may increase the effective area of the side surface of the second bank 43, that is, the area where the organic light emitting material and the second bank 43 contact.

In the fifth embodiment, the first branch lines 71-1 and 71-2 of the 2-1 opening 71 formed in the dummy area DA may be shorter in length than those shown in FIG. 8 as described above. That is, as the first branch lines 71-1 and 71-2 are provided in the 2-1 opening 71, and the area in which the organic light emitting material and the second bank 43 contact each other is relatively increased, and thus, the lengths of the first branch lines 71-1 and 71-2 can be relatively short. Accordingly, the area of the dummy area DA can be reduced in order to reduce the bezel.

On the other hand, the 2-2 opening 73 is an area extending from the display area AA into the non-display area NA and including the second branch lines in which at least two branches are formed. For example, the 2-2 opening 73 in the non-display area NA may include two second branch lines 73-1 and 73-2. The second branch lines 73-1 and 73-1, are disposed in the dummy area DA of the non-display area NA, are formed narrower than the width of the 2-2 opening 73 in the display area AA. The second branch lines 73-1 and 73-2 have a width narrower than the width of the 2-2 opening 73 in the display area AA, so that when the organic light emitting material is dropped and spread evenly, the capillary phenomenon occurs so the organic light emitting material is moved well through the second branch lines 73-1 and 73-2. In addition, since the second branch lines 73-1 and 73-2 are confined to the second bank 43, as described above, despite of the second bank 43 having a side of hydrophobicity, the second branch lines may serve to hold the organic light emitting material so that it does not gather at the center of the display area AA. That is, the second branch lines 73-1 and 73-2 may increase the effective area of the side surface of the second bank 43, that is, the area where the organic light emitting material and the second bank 43 contact.

That is, the second branch lines 73-1 and 73-2 included in the 2-2 opening 73 hold the organic light emitting material so that the organic light emitting material does not gather from the edge portion, that is, the dummy area DA to the center of the display area AA and thus, by generating a capillary phenomenon, the organic light emitting material may be maintained in the dummy area DA to be formed to a certain thickness.

As described above, in the fifth embodiment, the second branch lines 73-1 and 73-2 of the 2-2 opening 73 formed in the dummy area DA may be shorter in length than those shown in FIG. 8 as described above. That is, as the second branch lines 73-1 and 73-2 are provided in the 2-2 opening 73, and the area in which the organic light emitting material and the second bank 43 contact each other is relatively increased, and thus, the lengths of the second branch lines 73-1 and 73-2 can be relatively short. Accordingly, the area of the dummy area DA can be reduced in order to reduce the bezel.

Similarly, the 2-3 opening 75 extends from the display area AA into the non-display area NA and the 2-3 opening 75 is an area where at least two or more third branch lines are formed. For example, the 2-3 opening 75 in the non-display area NA may include three third branch lines 75-1, 75-2 and 75-3. The third branch lines 75-1, 75-2 and 75-3 are disposed in the dummy area DA of the non-display area NA and the width of each third branch line is narrower than the width of the 2-3 opening 75 in the display area AA. The third branch lines 75-1, 75-2 and 75-3 are made narrower than the width of the 2-3 opening 75 in the display area AA. Therefore, when the organic light emitting material is dropped and spread evenly, a capillary phenomenon acts to allow the organic light emitting material to move well through the third branch lines 75-1, 75-2, and 75-3. In addition, since the third branch lines 75-1, 75-2, and 75-3 are confined to the second bank 43, as described above, despite of the second bank 43 having a side of hydrophobicity, the third branch lines may serve to hold the organic light emitting material so that it does not gather at the center of the display area AA.

As described above, in the fifth embodiment, the third branch lines 75-1, 75-2, and 75-3 of the 2-3 opening 75 formed in the dummy area DA may be shorter in length than those shown in FIG. 8 as described above. That is, as the third branch lines 75-1, 75-2, and 75-3 are provided in the 2-3 opening 75, and the area in which the organic light emitting material and the second bank 43 contact each other is relatively increased, and thus, the lengths of the third branch lines 75-1, 75-2, and 75-3 can be relatively short. Accordingly, the area of the dummy area DA can be reduced in order to reduce the bezel.

Meanwhile, referring to FIG. 16, according to the fifth embodiment of the present disclosure, in the organic light emitting display device 500-1, any one of the second openings 44 includes at least two branch lines in the non-display area NA, and branch lines diverged into two or more may be connected to each other.

Specifically, the 2-1 opening 71 is an area extending from the display area AA into the non-display area NA and including the first branch lines in which at least two branches are formed. For example, the 2-1 opening 71 in the non-display area NA may include two first branch lines 71-1 and 71-2. The first branch lines 71-1 and 71-2, are disposed in the dummy area DA of the non-display area NA, are formed narrower than the width of the 2-1 opening 71 in the display area AA. The first branch lines 71-1 and 71-2 have a width narrower than the width of the 2-1 opening 71 in the display area AA, so that when the organic light emitting material is dropped and spread evenly, the capillary phenomenon occurs so the organic light emitting material is moved well through the first branch lines 71-1 and 71-2. In addition, since the first branch lines 71-1 and 71-2 are confined to the second bank 43, as described above, despite of the second bank 43 having a side of hydrophobicity, the first branch lines may serve to hold the organic light emitting material so that it does not gather at the center of the display area AA. That is, the first branch lines 71-1 and 71-2 may increase the effective area of the side surface of the second bank 43, that is, the area where the organic light emitting material and the second bank 43 contact.

The 2-2 opening 73 is an area extending from the display area AA into the non-display area NA and including the second branch lines in which at least two branches are formed. For example, the 2-2 opening 73 in the non-display area NA may include two second branch lines 73-1 and 73-2. The second branch lines 73-1 and 73-1, are disposed in the dummy area DA of the non-display area NA, are formed narrower than the width of the 2-2 opening 73 in the display area AA. The second branch lines 73-1 and 73-2 have a width narrower than the width of the 2-2 opening 73 in the display area AA, so that when the organic light emitting material is dropped and spread evenly, the capillary phenomenon occurs so the organic light emitting material is moved well through the second branch lines 73-1 and 73-2. In addition, since the second branch lines 73-1 and 73-2 are confined to the second bank 43, as described above, despite of the second bank 43 having a side of hydrophobicity, the second branch lines may serve to hold the organic light emitting material so that it does not gather at the center of the display device. That is, the second branch lines 73-1 and 73-2 may increase the effective area of the side surface of the second bank 43, that is, the area where the organic light emitting material and the second bank 43 contact.

That is, the second branch lines 73-1 and 73-2 included in the 2-2 opening 73 hold the organic light emitting material so that the organic light emitting material does not gather from the edge portion, that is, the dummy area DA to the center of the display area AA and thus, by generating a capillary phenomenon, the organic light emitting material may be maintained in the dummy area DA to be formed to a certain thickness.

In the fifth embodiment, the second branch lines 73-1 and 73-2 may be connected to each other. As shown in FIG. 16, a plurality of second horizontal branch lines 73-5 connecting the second branch lines 73-1 and 73-2 are formed. The plurality of second horizontal branch lines 73-5 connect the second branch lines 73-1 and 73-2 to each other, such that the effective area of the side surface of the second bank 43, that is, an area in which the organic light emitting material and the second bank 43 contact each other may be increased. Accordingly, the plurality of second horizontal branch lines 73-5 may hold the organic light emitting material so that the organic light emitting material does not gather from the edge portion, that is, the dummy area DA to the center of the display area AA.

Similarly, the 2-3 opening 75 extends from the display area AA into the non-display area NA and the 2-3 opening 75 is an area where at least two or more third branch lines are formed. For example, the 2-3 opening 75 in the non-display area NA may include three third branch lines 75-1, 75-2 and 75-3. The third branch lines 75-1, 75-2 and 75-3 are disposed in the dummy area DA of the non-display area NA and the width of each third branch line is narrower than the width of the 2-3 opening 75 in the display area AA. The third branch lines 75-1, 75-2 and 75-3 are made narrower than the width of the 2-3 opening 75 in the display area AA. Therefore, when the organic light emitting material is dropped and spread evenly, a capillary phenomenon acts to allow the organic light emitting material to move well through the third branch lines 75-1, 75-2, and 75-3. In addition, since the third branch lines 75-1, 75-2, and 75-3 are confined to the second bank 43, as described above, despite of the second bank 43 having a side of hydrophobicity, the third branch lines may serve to hold the organic light emitting material so that it does not gather at the center of the display area AA.

In the fifth embodiment, the third branch lines 75-1, 75-2, 75-3 can be connected to each other. As shown in FIG. 16, a plurality of third horizontal branch lines 75-5, connecting the third branch lines 75-1, 75-2, and 75-3 to each other, is formed. The plurality of third horizontal branch lines 75-5 connects the third branch lines 75-1, 75-2, and 75-3 to each other, so that the effective area of the side surface of the second bank 43, that is, an area in which the organic light emitting material and the second bank 43 contact each other may be increased. Accordingly, the third horizontal branch lines 75-5 may hold the organic light emitting material so that the organic light emitting material does not gather from the edge portion, that is, the dummy area DA to the center of the display area AA.

As described above, in the fifth embodiment, the second branch lines 73-1 and 73-2 of the 2-2 opening 73 and the third branch lines 75-1, 75-2, and 75-3 of the 2-3 opening 75 formed in the dummy area DA may be shorter in length than those shown in FIG. 8 as described above. That is, as the second branch lines 73-1 and 73-2 are provided in the 2-2 opening 73 and the third branch lines 75-1, 75-2, and 75-3 are provided in the 2-3 opening 75, and the area in which the organic light emitting material and the second bank 43 contact each other is relatively increased, and thus, the lengths thereof can be relatively short. Accordingly, the area of the dummy area DA can be reduced in order to reduce the bezel.

As described in the first embodiment described above, during the curing process of the organic light emitting material, the organic light emitting material gathers in the center of the display area, and thus, an edge curling phenomenon in which the amount of the organic light emitting material is relatively reduced in the edge portion may occur. In the fifth embodiment of the present disclosure, by forming branch lines in the dummy area DA of the non-display area NA, it can hold the organic light emitting material so that the organic light emitting material does not gather from the edge portion, that is, the dummy area DA to the center of the display area AA, and thus, the capillary phenomenon occurs, and the organic light emitting material may be maintained in the dummy area DA to be formed to a certain thickness. Further, by forming a plurality of horizontal branch lines connecting the branch lines to each other, an area in which the organic light emitting material and the second bank 43 contact each other can be increased. Therefore, there is an advantage that the horizontal branch lines can hold the organic light emitting material such that the organic light emitting material is not gathered from the edge portion, that is, the dummy area DA, to the central portion of the display area AA. Hence, there is an advantage that can significantly improve the degradation of the display quality due to the thickness variation of the organic light emitting layer 50 according to the position. Furthermore, since the length of the branch lines can be shortened, there is an advantage that the bezel area can be reduced.

Through the above description, those skilled in the art will be able to variously change and modify without departing from the technical spirit of the present disclosure. Therefore, the technical scope of the present disclosure should not be limited to the contents described in the detailed description of the specification, but should be determined by the scope of the claims.

What is claimed is:

1. An organic light emitting display device comprising:
a substrate including a display area including a plurality of sub-pixels and a non-display area other than the display area;
an overcoat layer on the substrate;
a plurality of first electrodes disposed on the overcoat layer in the plurality of sub-pixels;
a first bank disposed in the display area and the non-display area, the first bank including a plurality of first openings exposing the plurality of first electrodes;
a second bank disposed on the first bank in the display area and the non-display area, the second bank including a plurality of second openings exposing the plurality of first electrodes arranged in one direction; and
a plurality of organic light emitting layers disposed in the plurality of second openings,
wherein at least one among the plurality of second openings is split into at least two branch lines in the non-display area.

2. The organic light emitting display device of claim 1, wherein the plurality of second openings includes a first sub-opening including a first organic light emitting layer, a second sub-opening including a second organic light emitting layer, and a third sub-opening including a third organic light emitting layer,
wherein the first organic light emitting layer, the second organic light emitting layer, and the third organic light emitting layer are different from each other.

3. The organic light emitting display device of claim 2, wherein the first sub-opening is not split, and the second sub-opening and the third sub-opening are split into more than two branch lines.

4. The organic light emitting display device of claim 3, wherein a number of branch lines of the second sub-opening is equal to or less than a number of branch lines of the third sub-opening.

5. The organic light emitting display device of claim 2, wherein at least one among the first sub-opening, the second sub-opening and the third sub-opening has the branch lines connected to each other at ends thereof.

6. The organic light emitting display device of claim 2, wherein at least one among the first sub-opening, the second sub-opening and the third sub-opening includes at least one horizontal branch line connecting the branch lines to each other.

7. The organic light emitting display device of claim 2, wherein the first organic light emitting layer is a red light emitting layer, the second organic light emitting layer is a green light emitting layer, and the third organic light emitting layer is a blue light emitting layer.

8. The organic light emitting display device of claim 2, wherein widths of the first sub-opening, the second sub-opening and the third sub-opening are different from each other.

9. The organic light emitting display device of claim 2, wherein a width of the first sub-opening is smaller than a width of the second sub-opening, and the width of the second sub-opening is smaller than a width of the third sub-opening.

10. The organic light emitting display device of claim 1, wherein the first bank has hydrophilicity and the second bank has hydrophobicity.

* * * * *